US009392171B2

United States Patent
Uemura et al.

(10) Patent No.: US 9,392,171 B2
(45) Date of Patent: Jul. 12, 2016

(54) ANGULAR VELOCITY SENSOR, AND ELECTRONIC APPARATUS USING SAME

(71) Applicant: Panasonic Corporation, Osaka (JP)

(72) Inventors: Takeshi Uemura, Osaka (JP); Hideyuki Murakami, Osaka (JP); Shinjiro Ueda, Osaka (JP); Ryota Sudo, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 202 days.

(21) Appl. No.: 14/383,373

(22) PCT Filed: Apr. 10, 2013

(86) PCT No.: PCT/JP2013/002427
§ 371 (c)(1),
(2) Date: Sep. 5, 2014

(87) PCT Pub. No.: WO2013/153802
PCT Pub. Date: Oct. 17, 2013

(65) Prior Publication Data
US 2015/0077579 A1 Mar. 19, 2015

(30) Foreign Application Priority Data

Apr. 12, 2012 (JP) .................... 2012-090759
Sep. 20, 2012 (JP) .................... 2012-206610
Oct. 4, 2012 (JP) .................... 2012-221981

(51) Int. Cl.
*G01C 19/56* (2012.01)
*H04N 5/232* (2006.01)
(Continued)

(52) U.S. Cl.
CPC ........ *H04N 5/23251* (2013.01); *G01C 19/5614* (2013.01); *H03F 1/0277* (2013.01);
(Continued)

(58) Field of Classification Search
CPC ................... H03F 1/0277; H03F 3/72; H03F 2203/45506; H03F 2203/45634; H03F 2203/45728; H03F 2203/7215; H03F 2203/7221; H03F 2203/7218; H03F 2203/7212; H04N 5/23258; G01C 19/5614; G01C 19/5607; G01C 19/56
See application file for complete search history.

(56) References Cited

U.S. PATENT DOCUMENTS 6,426,672 B1* 7/2002 Petrick ...................... H03F 1/26
327/530
2007/0261488 A1* 11/2007 Murashima ........ G01C 19/5607
73/504.04

(Continued)

FOREIGN PATENT DOCUMENTS

| JP | 2002-303644 A | 10/2002 |
|----|---------------|---------|
| JP | 2004-294404 A | 10/2004 |

(Continued)

OTHER PUBLICATIONS

International Search Report for Application No. PCT/JP2013/002427 dated Jul. 23, 2013.

*Primary Examiner* — Blake A Tankersley
(74) *Attorney, Agent, or Firm* — Pearne & Gordon LLP

(57) ABSTRACT

A motion sensor includes a sensor element that outputs a sense signal in response to a motion applied thereto and a sensor circuit that senses the motion based on the sense signal. The sensor circuit includes a sensor-element-signal amplifier that receives the sense signal. The sensor-element-signal amplifier operates switchably between at a normal mode and at a low-noise mode that consumes a larger electric power and produces a smaller noise than the normal mode. This motion sensor senses a small motion and a large motion accurately.

22 Claims, 16 Drawing Sheets

(51) Int. Cl.
*G01C 19/5614* (2012.01)
*H03F 1/02* (2006.01)
*H03F 3/45* (2006.01)
*H03F 3/72* (2006.01)

(52) U.S. Cl.
CPC .............. *H03F3/45183* (2013.01); *H03F 3/72* (2013.01); *H03F 2203/45454* (2013.01); *H03F 2203/45476* (2013.01); *H03F 2203/45506* (2013.01); *H03F 2203/45631* (2013.01); *H03F 2203/45632* (2013.01); *H03F 2203/45634* (2013.01); *H03F 2203/45674* (2013.01); *H03F 2203/45692* (2013.01); *H03F 2203/45702* (2013.01); *H03F 2203/45728* (2013.01); *H03F 2203/7215* (2013.01); *H03F 2203/7221* (2013.01)

(56) References Cited

U.S. PATENT DOCUMENTS

| | | |
|---|---|---|
| 2008/0111627 A1 | 5/2008 | Fukuzawa |
| 2008/0174444 A1 | 7/2008 | Noda et al. |
| 2010/0130249 A1* | 5/2010 | Tam ............... H03F 1/0277 455/556.1 |

FOREIGN PATENT DOCUMENTS

| | | |
|---|---|---|
| JP | 2004-320377 A | 11/2004 |
| JP | 2005-308470 A | 11/2005 |
| JP | 2007-218717 A | 8/2007 |
| JP | 2008-124700 A | 5/2008 |
| JP | 2008-175771 A | 7/2008 |

* cited by examiner

ANGULAR VELOCITY SENSOR, AND ELECTRONIC APPARATUS USING SAME

This application is a U.S. national stage application of the PCT international application No.PCT/JP2013/002427.

TECHNICAL FIELD

The present invention relates to a motion sensor that detects a small motion and a large motion, and to an electronic apparatus including the motion sensor.

BACKGROUND ART

Portable small electronic apparatuses, such as digital cameras, portable phones, portable game machines, having plural functions and including sensors, such as angular velocity sensors and acceleration sensors, have been widely used in recent years. These apparatuses can be swung or revolved on purpose by users, and yet, they are equipped with cameras. When these apparatuses function as cameras, a motion sensor thereof can sense camera shake for correcting an image. This motion sensor senses a rather large motion caused by operating the apparatus, and also senses a rather small motion, such as camera shake. PTL 1 discloses a motion sensor that senses a large motion and a small motion.

FIG. 16 is a block diagram of conventional motion sensor 500 that senses a large motion and a small motion. Motion sensor 500 includes small-range motion sensor 501 for sensing a small acceleration, a large-range motion sensor 502 for sensing a large acceleration, selector 503 for switching between output signal S501 supplied from small-range motion sensor 501 and output signal S502 supplied from large-range motion sensor 502, signal processor 504 for processing output signal S503 supplied from selector 503, and controller 505 for controlling selector 503.

Controller 505 usually operates low range motion sensor 501; however, when an acceleration sensed by small-range motion sensor 501 exceeds a predetermined threshold, controller 505 operates large-range motion sensor 502.

CITATION LIST

Patent Literature

PTL 1: Japanese Patent Laid-Open Publication No. 2008-175771

SUMMARY

A motion sensor includes a sensor element that outputs a sense signal in response to a motion applied thereto and a sensor circuit that senses a motion based on the sense signal. The sensor circuit includes a sensor-element-signal amplifier that receives the sense signal. The sensor-element-signal amplifier operates switchably between at a normal mode and at a low-noise mode that consumes larger power and produces a smaller noise than the normal mode.

The motion sensor can sense a small motion and a large motion accurately.

DETAIL DESCRIPTION OF PREFERRED EMBODIMENTS

Exemplary Embodiment 1

Figure 1:
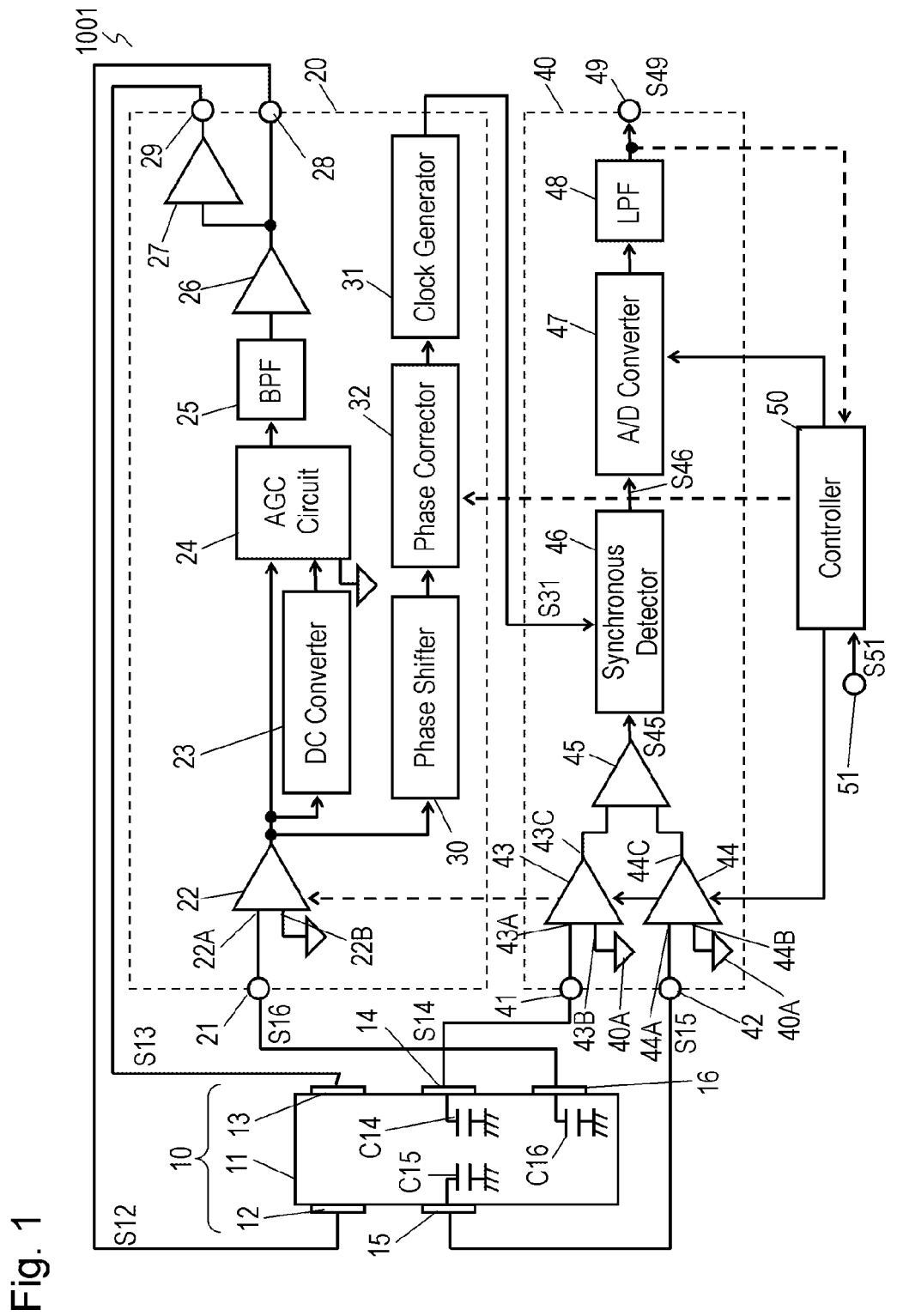
FIG. 1 is a block diagram of a motion sensor in accordance with Exemplary Embodiment 1 of the present invention.

FIG. 1 is a block diagram of motion sensor 1001 in accordance with Exemplary Embodiment 1 of the present invention. Motion sensor 1001 is an angular velocity sensor. Motion sensor 1001 includes sensor element 10, drive circuit 20 that drives sensor element 10, sensor circuit 40 that processes a signal output from sensor element 10 to sense a motion (an angular velocity) applied to sensor element 10, and controller 50 that controls drive circuit 20 and sensor circuit 40. Motion sensor 1001 in accordance with Embodiment 1 functions as an angular velocity sensor for sensing an angular velocity, a motion, applied to sensor element 10.

Figure 2:
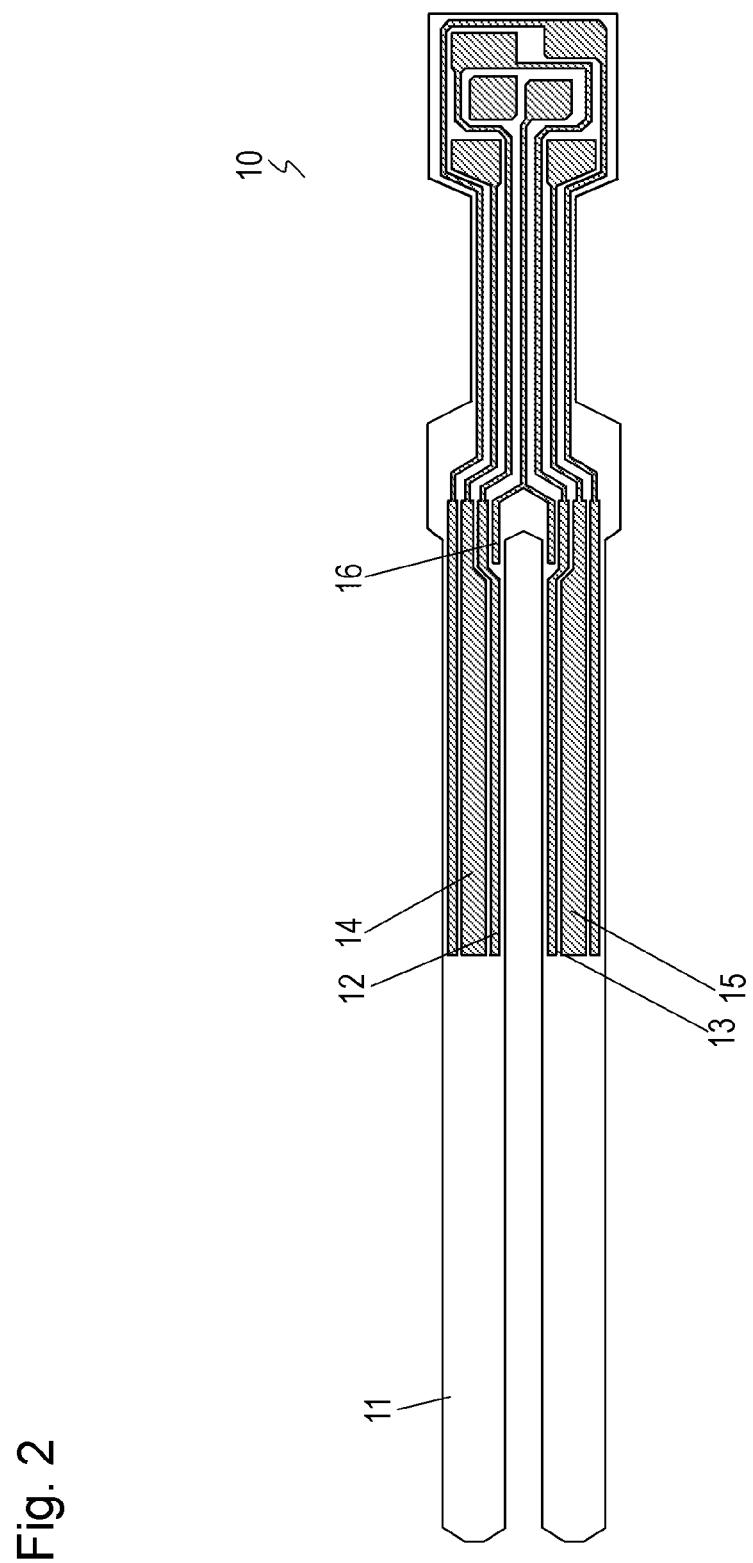
FIG. 2 is a plan view of a sensor element of the motion sensor in accordance with Embodiment 1.

FIG. 2 is a plan view of sensor element 10. Sensor element 10 includes vibrator 11 having a tuning-fork shape, driver units 12 and 13, sensor units 14 and 15, and monitor unit 16. Driver units 12 and 13, sensor units 14 and 15, and monitor unit 16 are disposed on vibrator 11 made of a non-piezoelectric material, such as a semiconductor substrate made of, e.g. silicon, fused quartz, or aluminum oxide. Vibrator 11 made of silicon can be processed by a fine processing technique, to have a small size. Each of driver units 12 and 13, sensor units 14 and 15, and monitor unit 16 includes a lower electrode disposed on vibrator 11, a piezoelectric material disposed on the lower electrode, and an upper electrode disposed on the piezoelectric material. A drive signal of alternating-current (AC) voltage applied to driver units 12 and 13 drives and causes vibrator 11 to vibrates. The frequency of the drive signal is a resonance frequency of vibrator 11, thus causing vibrator 11 to vibrate stably at the resonance frequency.

Monitor unit 16 outputs monitor signal S16 of a current in response to the vibration of vibrator 11. During the vibration of vibrator 11, an angular velocity applied to vibrator 11 produces a Coriolis force on vibrator 11. Vibrator 11 deforms in response to the Coriolis force, and has a distortion. Sensor units 14 and 15 output sense signals S14 and S15 of currents in response to the distortion (FIG. 1).

As shown in FIG. 1, drive circuit 20 includes monitor input terminal 21 connected to monitor unit 16 of sensor element 10, drive output terminals 28 and 29 connected to driver units 12 and 13, respectively, sensor-element-signal amplifier 22 connected to monitor input terminal 21, direct-current (DC) converter 23, automatic gain control (AGC) circuit 24, band pass filter (BPF) 25, output amplifier 26 for amplifying an output from BPF 25, inverting amplifier 27 for inverting an output from output amplifier 26, phase shifter 30, clock generator 31, and phase corrector 32. Sensor-element-signal amplifier 22 converts the current (i.e. monitor signal S16) to a voltage and outputting the voltage. DC converter 23 outputs a DC voltage to AGC circuit 24 according to amplitude of the voltage supplied from sensor-element-signal amplifier 22. AGC circuit 24 amplifies the voltage supplied from sensor-element-signal amplifier 22 at a gain determined based on the DC voltage supplied from DC converter 23, and outputs the amplified voltage. BPF 25 removes unnecessary frequency components from the voltage supplied from AGC circuit 24. Output amplifier 26 amplifies the output from BPF 25, and outputs the amplified output as a drive signal to driver unit 12 of sensor element 10 via drive output terminal 28. Inverting amplifier 27 inverts the output from output amplifier 26, and outputs the inverted output one as a drive signal to driver unit 13 of sensor element 10 via drive output terminal 29. The drive signals supplied to driver units 12 and 13 cause vibrator 11 to vibrate. As discussed above, output amplifier 26 drives and causes vibrator 11 to vibrate based on monitor signal S16. AGC circuit 24 controls the output to BPF 25 based on the DC voltage supplied from DC converter 23 so that vibrator 11 can vibrate with constant amplitude. Phase shifter 30 shifts a phase, by 90 degrees, of the voltage supplied from sensor-element-signal amplifier 22. Phase corrector 32 adjusts a phase of the output from phase shifter 30. Clock generator 31 generates clock signal S31 shaped to have a rectangular waveform. Clock generator 31 thus generates clock signal S31 based on monitor signal S16 and in response to an output from phase shifter 30.

Sensor circuit 40 includes input terminals 41 and 42 connected to sensor units 14 and 15, respectively, and output terminal 49. Input terminals 41 and 42 receive sense signals S14 and S15 supplied from sensor units 14 and 15, respectively. Sensor circuit 40 includes sensor-element-signal amplifier 43 having input port 43A connected to input terminal 41, sensor-element-signal amplifier 44 having input terminal 44A connected to input terminal 42, differential amplifier 45 connected to output terminals 43C and 44C of sensor-element-signal amplifiers 43 and 44, synchronous detector 46 connected to differential amplifier 45, analog/digital (A/D) converter 47 connected to synchronous detector 46, and low pass filter (LPF) 48 connected to A/D converter 47. Sensor-element-signal amplifiers 43 and 44 have input terminals 43B and 44B connected to reference potential 40A, and convert the currents (sense signals S14 and S15) received at input ports 43A and 44A into voltages and output the voltages from output terminals 43C and 44C, respectively. Differential amplifier 45 outputs difference signal S45 that is a difference between the voltages output from output terminals 43C and 44C of sensor-element-signal amplifiers 43 and 44. Each of sense signals S14 and S15 includes a sense component produced in response to the motion, an angular velocity, applied to sensor element 10 and a vibration component produced due to the vibration of vibrator 11 caused by drive signals S12 and S13. The sense components of sense signals S14 and S15 have phases opposite to each other while the vibration components have phases identical to each other. Differential amplifier 45 cancels the vibration components of sense signals S14 and S15, and outputs only the sense components as difference signal S45. Synchronous detector 46 detects difference signal S45 synchronously to clock signal S31 output from clock generator 31, and outputs detected signal S46. The sense components of sense signals S14 and S15 have phases shifted by 90 degrees from the phase of monitor signal S16 that is produced in response to the vibration of vibrator 11. Clock signal S31 that is produced based on monitor signal S16 by phase shifter 30 and clock generator 31 has a phase shifted by 90 degrees from the sense components. Synchronous detector 46 detects difference signal S45 synchronously to clock signal S31, thereby outputting detected signal S46 that contains only the sense components. A/D converter 47 converts detected signal S46 into a digital signal, and LPF 48 removes unnecessary signals from the digital signal, and then outputs the resultant signal (i.e. motion signal S49) from output terminal 49.

Controller 50 controls the sensor-element-signal amplifiers 43 and 44 based on control signal S51 received at control terminal 51. Controller 50 also controls A/D converter 47 and phase corrector 32 of drive circuit 20.

Each of driver units 12 and 13, sensor units 14 and 15, and monitor unit 16 forms a capacitor that includes an upper electrode and a lower electrode facing each other across the piezoelectric material. To be more specific, as shown in FIG. 1, sensor unit 14, sensor unit 15, and monitor unit 16 form capacitor C14, capacitor C15, and capacitor C16, respectively.

Figure 3:
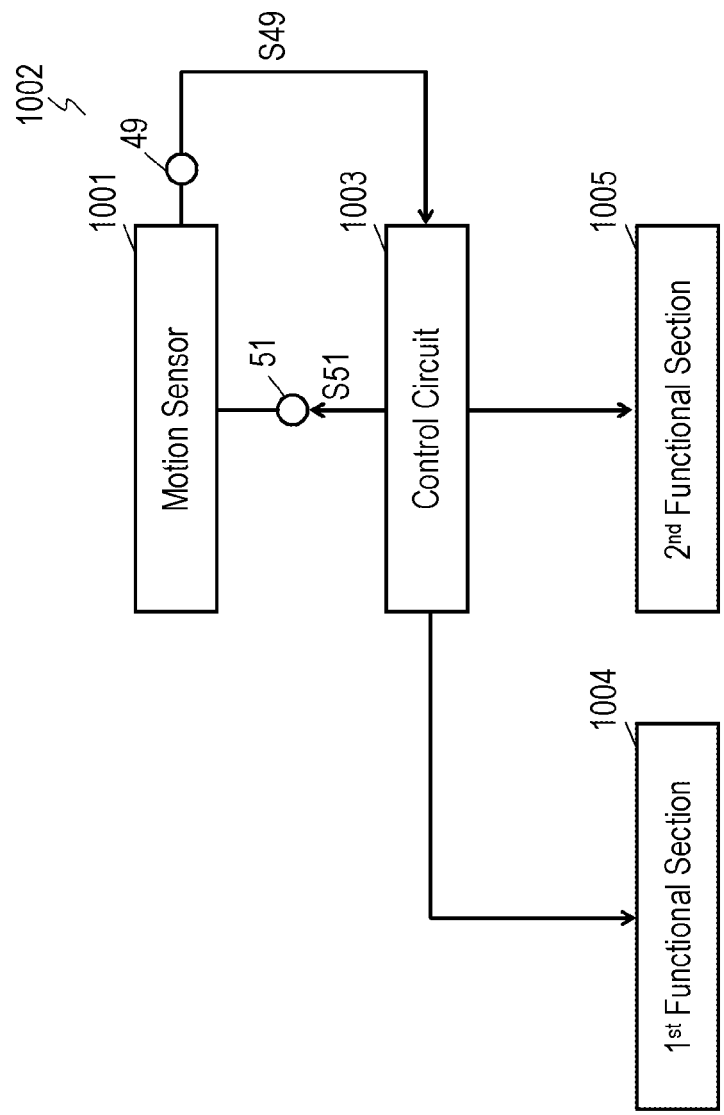
FIG. 3 is a block diagram of an electronic apparatus including the motion sensor in accordance with Embodiment 1.

FIG. 3 is a block diagram of electronic apparatus 1002 employing motion sensor 1001. Electronic apparatus 1002 includes first functional section 1004 that uses a small motion to execute a first function and second functional section 1005 that uses a large motion to execute a second function. Electronic apparatus 1002 in accordance with Embodiment 1 is a portable electronic apparatus including a camera function as the first functional section, and a game machine function and a phone function as the second functional section. Electronic apparatus 1002 includes motion sensor 1001, first functional section 1004 that executes the first predetermined function, second functional section 1005 that executes the second predetermined function, such as the game function and the phone function, and control circuit 1003 that controls motion sensor 1001, first functional section 1004, and second functional section 1005. When a user uses electronic apparatus 1002 as a game machine or a phone, the user provides electronic apparatus 1002 with a motion, such as shaking or rotating, intentionally. Then, motion sensor 1001 senses the motion and outputs motion signal S49 to control circuit 1003 via output terminal 49 in response to the motion. Control circuit 1003 controls second functional section 1005 in response to motion signal S49 and causes second functional section 1005 to execute the game function or the phone function. When the user uses electronic apparatus 1002 as a camera, motion sensor 1001 senses a motion, such as a vibration due to camera shaking, and outputs motion signal S49 in response to the motion. Control circuit 1003 then cancels influence caused by the camera shaking to an image by an electronic correction method or an optical correction method. The electronic correction method corrects an image obtained by first functional section 1004, and the optical correction method corrects a camera lens. Control circuit 1003 outputs, to control terminal 51 of motion sensor 1001, control signal S51 which indicates which one of first functional section 1004 or second functional section 1005 operates.

Figure 4:
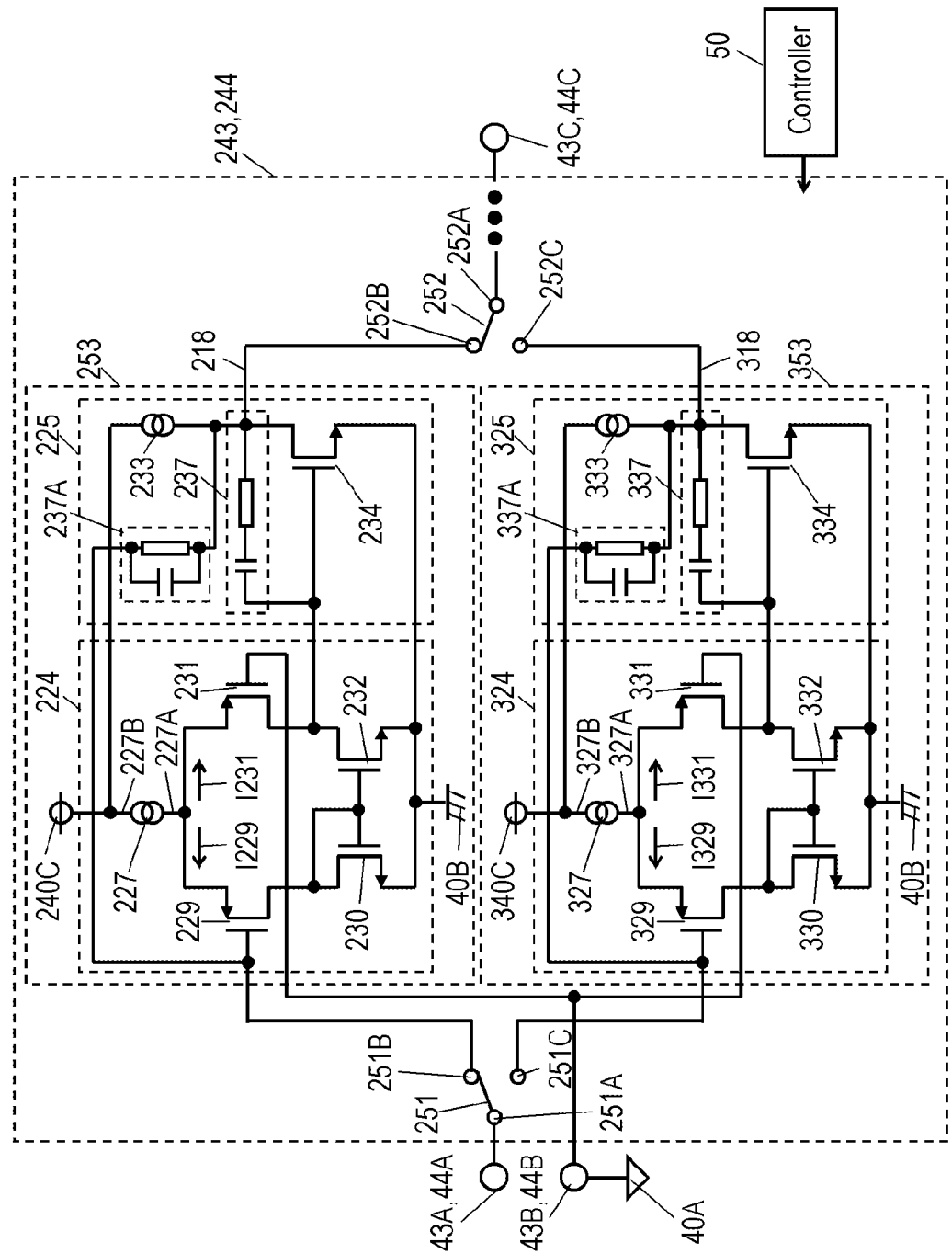
FIG. 4 is a circuit diagram of an essential part of a sensor-element-signal amplifier of the motion sensor in accordance with Embodiment 1.

FIG. 4 is a circuit diagram of an essential part of sensor-element-signal amplifiers 243 and 244 functioning as sensor-element-signal amplifiers 43 and 44. FIG. 4 particularly details a part connected to input ports 43A and 44A. Differential amplifying circuit 224 and amplifying circuit 225 constitute sensor-element-signal amplifying circuit 253. Differential amplifying circuit 324 and amplifying circuit 325 constitute sensor-element-signal amplifying circuit 353.

Switch 251 includes common end 251A connected to input port 43A (44A), and branch ends 251B and 251C. Common end 251A of switch 651 is connected selectively to branch ends 251B and 251C. Common end 251A receives sense signal S14 (S15) via input port 43A (44A).

Differential amplifying circuit 224 includes semiconductor amplifying elements 229 and 231 that are P-channel field effect transistors (FET), semiconductor amplifying elements 230 and 232 that are N-channel FETs, and bias-current source 227. Bias-current source 227 has one end 227B connected to power supply 240C. Amplifying elements 229 and 230 are connected in series between another end 227A of bias-current source 227 and reference potential 40B and connected to end 227A of bias-current source 227 and reference potential 40B. Amplifying elements 231 and 232 are connected in series between end 227A of bias-current source 227 and reference potential 40B and connected to end 227A of bias-current source 227 and reference potential 40B. A drain of amplifying element 229 is connected to a drain of amplifying element 230. A drain of amplifying element 231 is connected to a drain of amplifying element 232. In other words, an assembly including amplifying elements 229 and 230 connected together and another assembly including amplifying elements 231 and 232 connected together are connected in parallel to each other between reference potential 40B and end 227A of bias-current source 227. Branch end 251B of switch 251 is connected to a gate of amplifying element 229. Input port 43B is connected to a gate of amplifying element 231. Gates of amplifying elements 230 and 232 are connected to the drains of amplifying elements 229 and 230. The drains of amplifying elements 231, 232 are connected to amplifying circuit 225. Amplifying circuit 225 includes semiconductor amplifying element 234 of N-channel FET connected between bias-current source 233 and reference potential 40B. The drains of amplifying elements 231 and 232 are connected to a gate of amplifying element 234. A drain of amplifying element 234 is connected to output port 218. Output port 218 is connected to branch end 252B of switch 252. I-V converting impedance element 237A is connected between the drain of amplifying element 234 and the gate of amplifying element 229. I-V converting impedance element 237A includes a resistor and a capacitor and has an impedance. The resistor is connected in series between the gate of amplifying element 229 and the drain of amplifying element 234 while the capacitor is connected in parallel to the resistor. However, I-V converting impedance element 237A may include other components forming the impedance instead of the resistor and the capacitor connected in parallel to each other. The drain of amplifying element 234 is connected to the gate of amplifying element 229 via I-V converting impedance element 237A, hence constituting a feedback loop. Anti-oscillation compensating circuit 237 having a time constant is connected between the drain and the gate of amplifying element 234. Bias-current source 227 supplies bias currents I229 and I231 to sources of amplifying elements 229 and 231, respectively.

Anti-oscillation compensating circuit 237 includes a resistor and a capacitor, and has a time constant. Anti-oscillation compensating circuit 237 is connected in series between the drain and the gate of amplifying element 234.

Differential amplifying circuit 324 includes semiconductor amplifying elements 329 and 331 of P-channel FET, semiconductor amplifying elements 330 and 332 of N-channel FET, and bias-current source 327. One end 327B of bias-current source 327 is connected to power supply 340C. Amplifying elements 329 and 330 are connected in series between another end 327A of bias-current source 327 and reference potential 40B, and connected to end 327A of bias-current source 327 and reference potential 40B. Amplifying elements 331 and 332 are connected in series between end 327A of bias-current source 327 and reference potential 40B. A drain of amplifying element 329 is connected to a drain of amplifying element 330. A drain of amplifying element 331 is connected to a drain of amplifying element 332. In other words, an assembly including amplifying elements 329 and 330 connected together and another assembly including amplifying elements 331 and 332 connected together are connected in parallel to each other between reference potential 40B and end 327A of bias-current source 327. Branch end 251C of switch 251 is connected to a gate of amplifying element 329. Input port 43B is also connected to the gate of amplifying element 331. Gates of amplifying elements 330 and 332 are connected to the drains of amplifying elements 329 and 330. The drains of amplifying elements 331 and 332 are connected to amplifying circuit 325. Amplifying circuit 325 includes semiconductor amplifying element 334 of N-channel FET connected between bias-current source 333 and reference potential 40B. The drains of amplifying elements 331 and 332 are connected to a gate of amplifying element 334. A drain of amplifying element 334 is connected to output port 318. Output port 318 is connected to branch end 252C of switch 252. I-V converting impedance element 337A is connected between the chain of amplifying element 334 and the gate of amplifying element 329. I-V converting impedance element 337A includes a resistor and a capacitor, and has an impedance. The resistor is connected in series between the gate of amplifying element 329 and the drain of amplifying element 334 while the capacitor is connected in parallel to the resistor. I-V converting impedance element 337A may include other components forming the impedance instead of the resistor and the capacitor connected in parallel to each other. The drain of amplifying element 334 is connected to the gate of amplifying element 329 via I-V converting impedance element 337A, hence constituting a feedback loop. Anti-oscillation compensating circuit 337 having a time constant is connected between the drain and the gate of amplifying element 334. Bias-current source 327 supplies bias currents I329 and I331 to sources of amplifying elements 329 and 331, respectively.

Anti-oscillation compensating circuit 337 includes a resistor and a capacitor, and has a time constant. Anti-oscillation compensating circuit 337 is connected in series between the drain and the gate of amplifying element 334.

Bias-current source 227 supplies a larger current than bias-current source 327, so that bias current I229 supplied to amplifying element 229 of sensor-element-signal amplifying circuit 253 is larger bias current I329 supplied to amplifying element 329 of sensor-element-signal amplifying circuit 353. Amplifying elements 229 and 329 produce mainly a flicker noises inversely proportional to frequency, and a thermal noise independent of the frequency. Bias current I229 larger than bias current I329 causes amplifier element 329 to produce a larger thermal noise than amplifying element 229.

Since the flicker noise does not depend so much on the bias current, noises produced by amplifying element 229 are smaller than noises produced by amplifying element 329 while amplifying element 229 consumes larger electric power than amplifying element 329. The time constants of anti-oscillation compensating circuits 237 and 337 are determined appropriately to the currents of bias-current sources 227 and 327, respectively, so that sensor-element-signal amplifying circuits 253 and 353 can operate stably.

Switch 251 includes common end 251A connected to input port 43A (44A), and branch ends 251B and 251C. In switch 251, common end 251A is connected selectively to one of branch ends 251B and 251C. Branch ends 251B and 251C are connected to amplifying elements 229 and 329, respectively. Switch 251 outputs a signal supplied from input port 43A (44A) selectively to one of amplifying elements 229 and 329.

Switch 252 includes common end 252A connected to input port 43C (44C), and branch ends 252B and 252C. In switch 252, common end 252A is connected selectively to one of branch ends 252B and 252C. Branch ends 252B and 252C are connected to output ports 218 and 318, respectively. Switch 252 outputs signals supplied from output ports 218 and 318 selectively to common end 252A.

An operation of motion sensor 1001 will be described below with reference to FIGS. 1 to 4. Motion sensor 1001 includes sensor-element-signal amplifier 243 (244) shown in FIG. 4 as sensor-element-signal amplifier 44 (43) shown in FIG. 1.

When control signal S51 indicates that control circuit 1003 of electronic apparatus 1002 causes second functional section 1005 to operate, controller 50 connects common end 251A of switch 251 selectively to branch end 251C, and disconnect common end 251A from branch end 251B. At this moment, controller 50 connects common end 252A of switch 252 selectively to branch end 252C, and disconnects common end 252A from branch end 252B. This connection allow sense signal S14 (S15) supplied from input port 43A (44A) to enter amplifying element 329 of differential amplifying circuit 324 of sensor-element-signal amplifying circuit 353. Sense signal S14 is amplified in differential amplifying circuit 324 and amplifying circuit 325 and is output from output port 318. The signal output from output port 318 is input to branch end 252C of switch 252 and is output from common end 252A. The signal output from common end 252A of switch 252 is output via an amplifying circuit, such as an operational amplifier as a voltage from output port 43C (44C). At this moment, controller 50 may turn on power supply 340C of sensor-element-signal amplifying circuit 353, and turn off power supply 240C of sensor-element-signal amplifying circuit 253. This operation reduces power consumption of sensor-element-signal amplifiers 243 and 244. Motion sensor 1001 senses a motion having large amplitude intentionally applied by the user.

When control signal S51 indicates that control circuit 1003 causes first functional section 1004 to operate, controller 50 connects common terminal 251A of switch 251 selectively to branch end 251B, and disconnects common terminal 251A from branch end 251C. At this moment, controller 50 connects common terminal 252A of switch 252 selectively to branch end 252B, and disconnects common terminal 252A from branch end 252C. This switching allow sense signal S14 (S15) supplied from input port 43A (44A) to enter amplifying element 229 of differential amplifying circuit 224 of sensor-element-signal amplifying circuit 253. Sense signal S14 is amplified in differential amplifying circuit 224 and amplifying circuit 225 and is output from output port 218. The signal output from output port 218 is input to branch end 252B of switch 252 and output from common end 252A. The signal output from common end 252A of switch 252 is output via an amplifying circuit, such as an operational amplifier, as a voltage from output port 43C (44C). At this moment, controller 50 may turn on power supply 240C of sensor-element-signal amplifying circuit 253, and turn off power supply 340C of sensor-element-signal amplifying circuit 353. This operation reduces power consumption of sensor-element-signal amplifiers 243 and 244. Motion sensor 1001 senses a motion having small amplitude due to camera shake caused by the user.

Figure 16:
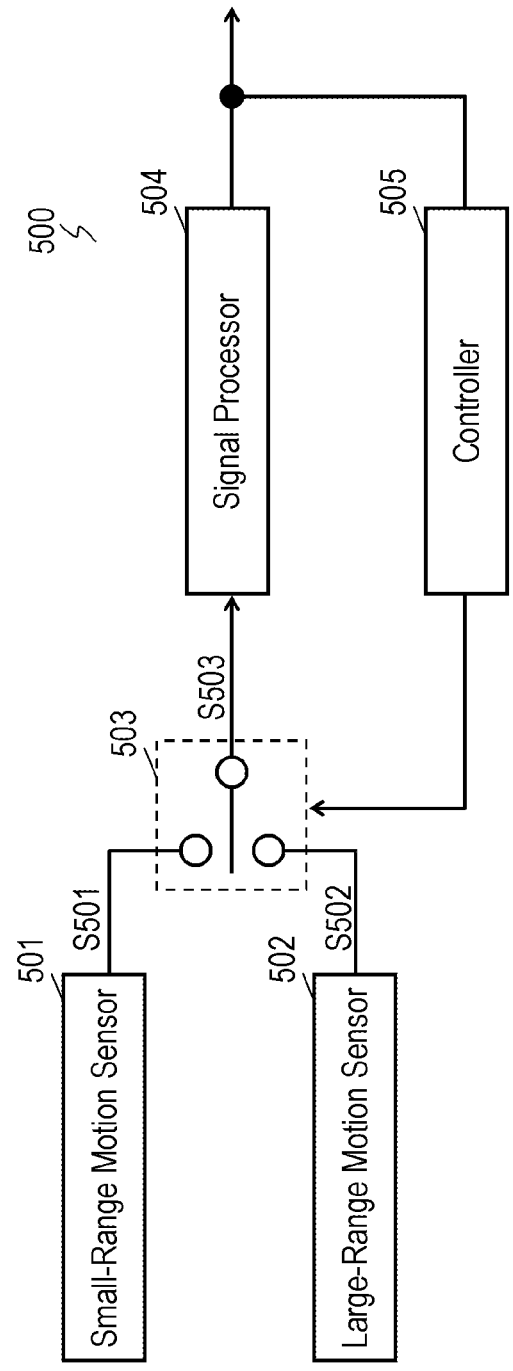
FIG. 16 is a block diagram of a conventional motion sensor.

As discussed above, amplifying element 229 produces a smaller noise than amplifying element 329, and consumes larger electric power than amplifying element 329. Motion sensor 1001 thus can sense a small motion caused by camera shake accurately. When motion sensor 1001 senses a large great motion, differential amplifying circuit 324 produces a large noise; however, the noise affect little to the sensing of the large motion. Further, since bias current I329 is small, motion sensor 1001 can operate with small current consumption. Conventional motion sensor 500 shown in FIG. 16 employs two sensor elements, namely, low-range motion sensor 501 and high-range motion sensor 502. This configuration prevents conventional motion sensor 500 from having a small size and being manufactured with a low cost. Motion sensor 1001 in accordance with Embodiment 1 in which switches 251 and 252 are switched in response to an amount of a motion, as discussed above, allows single sensor element 10 to sense a small motion accurately and to sense a large motion with small current consumption.

The current of bias-current source 233 may be larger than the current of bias-current source 333. This configuration allows amplifying element 234 to produce a smaller noise than amplifying element 234, and allows amplifying element 334 to consume larger electric power than amplifying element 334. This operation provides both an accurate detection of a small motion and low power consumption during a detection of a large motion.

I-V converting impedance element 337A may have larger impedance than I-V converting element 237A. This configuration allows an S/N ration of I-V converting element 237A of sensor-element-signal amplifying circuit 253 operating at the low-noise mode to be larger than an S/N ratio of I-V converting element 337A of sensor-element-signal amplifying circuit 353 operating at the normal mode. Thus, motion sensor 1001 thus can detect a small motion accurately.

As discussed above, sensor-element-signal amplifier 243 (244) operates switchably between at the normal mode and at the low-noise mode that consumes larger power and produces a smaller noise than the normal mode. Amplifying element 229 consumes larger power and produces a smaller noise than amplifying element 329. Common end 251A of switch 251 is connected to branch end 251B and is disconnected from branch end 251C, so that sensor-element-signal amplifiers 243 and 244 operate at the normal mode. In other words, switch 251 is switched to allow sensor-element-signal amplifiers 243 and 244 to operate selectively at the normal mode or at the low-noise mode. Common end 251A of switch 251 is connected to branch end 251C and is disconnected from branch end 251B, so that sensor-element-signal amplifiers 243 and 244 operate at the low-noise mode. The normal mode and the low-noise mode can be switched from outside of motion sensor 1001. At this moment, controller 50 controls both of phase corrector 32 and the offset and gain of A/D converter 47 shown in FIG. 1. This operation can sense the motion regardless of the amount of the motion.

Sensor-element-signal amplifier 22 that receives monitor signal S16 may be implemented by the same circuit as sensor-element-signal amplifiers 243 and 244 shown in FIG. 4.

Figure 5:
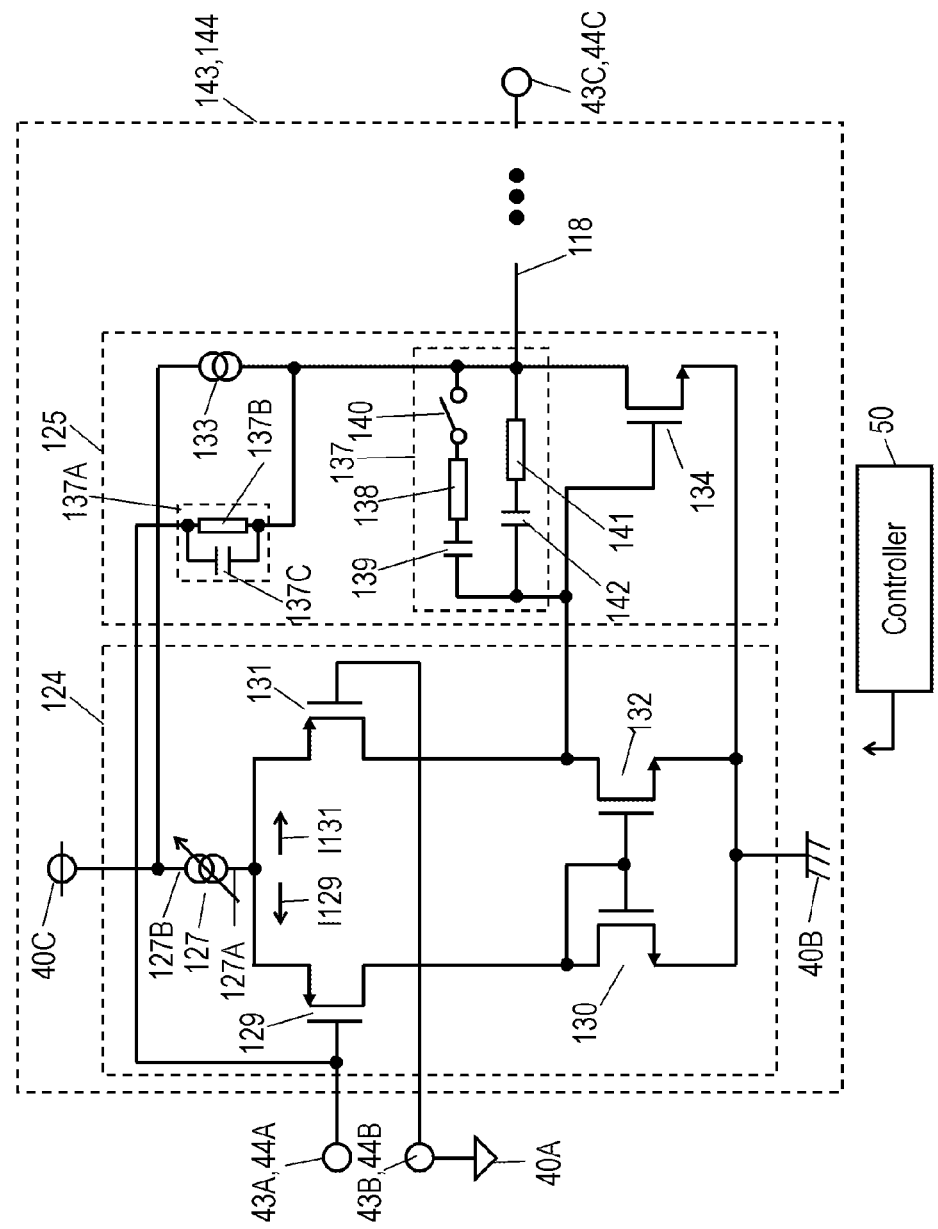
FIG. 5 is a circuit diagram of an essential part of another sensor-element-signal amplifier of the motion sensor in accordance with Embodiment 1.

FIG. 5 is an essential part of a circuit diagram of other sensor-element-signal amplifiers 143 and 144 functioning as sensor-element-signal amplifiers 43 and 44 of motion sensor 1001 in accordance with Embodiment 1, respectively. FIG. 5 particularly details a section where amplifiers 143 and 144 are connected to input ports 43A and 44A. In FIG. 5, components identical to those of sensor-element-signal amplifier 243 and 244 shown in FIG. 4 are denoted by the same reference numerals. Each of sensor-element-signal amplifiers 143 and 144 includes differential amplifying circuit 124 and amplifying circuit 125 instead of differential amplifying circuits 224 and 324 and amplifying circuits 225 and 325 of sensor-element-signal amplifiers 243 and 244, but does not include switch 251 or 252. Differential amplifying circuit 124 of each of sensor-element-signal amplifiers 143 and 144 amplifies a difference between voltages of input ports 43A and 43B. Amplifying circuit 125 of each of sensor-element-signal amplifiers 143 and 144 amplifies an output from differential amplifying circuit 124. Differential amplifying circuit 124 includes semiconductor amplifying elements 129 and 131 of P-channel FETs, semiconductor amplifying elements 130 and 132 of N-channel FETs; and bias-current source 127. One end 127B of bias-current source 127 is connected to power supply 40C. Amplifying elements 129 and 130 are connected in series between another end 127A of bias-current source 127 and reference potential 40B, and connected to end 127A of bias-current source 127 and reference potential 40B. Amplifying elements 131 and 132 are connected in series between end 127A of bias-current source 127 and reference potential 40B, and connected to end 127A of bias-current source 127 and reference potential 40B. A drain of amplifying element 129 is connected to a drain of amplifying element 130. A drain of amplifying element 131 is connected to a drain of amplifying element 132. In other words, an assembly including amplifying elements 129 and 130 connected together and another assembly including amplifying elements 131 and 132 connected together are connected in parallel to each other between reference potential 40B and end 127A of bias-current source 127. Input port 43A is connected to a gate of amplifying element 129. Input port 43B is connected to a gate of amplifying element 131. Gates of amplifying elements 130 and 132 are connected to the drains of amplifying elements 129 and 130. The drains of amplifying elements 131 and 132 are connected to amplifying circuit 125. Amplifying circuit 125 includes semiconductor amplifying element 134 of N-channel FET connected between current source 133 and reference potential 40B. The drains of amplifying elements 131 and 132 are connected to a gate of amplifying element 134. A drain of amplifying element 134 is connected to output port 118. A signal supplied from output port 118 is output via an amplifying circuit, such as an operational amplifier, as a voltage from output port 43C (44C). I-V converting impedance element 137A is connected between a drain of amplifying element 134 and the gate of amplifying element 129. According to Embodiment 1, I-V converting impedance element 137A includes resistor 137B and capacitor 137C, and has an impedance. Resistor 137B is connected in series between the gate of amplifying element 129 and the drain of amplifying element 134 while capacitor 137C is connected in parallel to resistor 137B. I-V converting impedance element 137A may include other components forming the impedance instead of resistor 137B and capacitor 137C connected in parallel to each other. The drain of amplifying element 134 is connected to the gate of amplifying element 129 via I-V converting impedance element 137A, hence constituting a feedback loop. Anti-oscillation compensating circuit 137 having a time constant is connected between the drain and the gate of amplifying element 134. Bias-current source 127 supplies bias currents I129 and I131 to sources of amplifying elements 129 and 131, respectively. amounts of bias currents I129 and I131 are switchable. Controller 50 changes the amount of the currents of bias-current source 127, thereby switching an operation of sensor-element-signal amplifiers 143 and 144 between at the normal mode and at the low-noise mode that consumes larger power and produces a smaller noise than the normal mode.

Anti-oscillation compensating circuit 137 includes resistors 138 and 141, capacitors 139 and 142, and switch 140. Resistor 138, capacitor 139, and switch 140 are connected in series between a source and gate of amplifying element 134. Resistor 141, capacitor 142 are connected in series between the source and gate of amplifying element 134. Controller 140 switches switch 140 to change the time constant of anti-oscillation compensating circuit 137.

An operation of motion sensor 1001 of electronic apparatus 1002 employing sensor-element-signal amplifier 143 (144) shown in FIG. 5 will be described below with reference to FIGS. 1 to 3 and 5. Sensor-element-signal amplifier 143 (144) functions as sensor-element-signal amplifier 44 (43) shown in FIG. 1. Control circuit 1003 of electronic apparatus 1002 outputs control signal S51 to controller 50 via control terminal 51 of motion sensor 1001. Controller 50 controls drive circuit 20 and sensor circuit 40 in response to control signal S51.

When control signal S51 indicates that control circuit 1003 operates second functional section 1005, controller 50 causes a current of bias-current source 127 of differential amplifying circuit 124 to be predetermined amount I1, and turns on switch 140 of anti-oscillation compensating circuit 137. Motion sensor 1001 senses a motion having large amplitude and applied intentionally by a user.

When control signal S51 indicates that control circuit 1003 operates first functional section 1004, controller 50 causes a current of bias-current source 127 of differential amplifying circuit 124 to be predetermined amount I2 that is larger than predetermined amount I1, and turns off switch 140 of anti-oscillation compensating circuit 137. Motion sensor 1001 senses a motion having small amplitude due to, e.g. vibration due to camera shake. Controller 50 switches switch 140 of anti-oscillation compensating circuit 137 in response to the amount of the motion, thereby changing the time constant of circuit 137.

In electronic apparatus 1002 shown in FIG. 3, the motion caused by camera shake is applied to motion sensor 1001 during the operation of first functional section 1004. This motion has much smaller amplitude than a motion applied intentionally by the user during the operation of second functional section 1005. First functional section 1004 corrects image data based on the sensed camera shake, or mechanically corrects the lens that forms an image on an imaging element, or the imaging element per se for eliminating blur, caused by the camera shake, in the image. To executing these corrections accurately, motion sensor 1001 senses the motion having small amplitude caused by the camera shake accurately. Sense signals S14 and S15 output from sensor units 14 and 15 of sensor element 10 are so weak that the motion having the small amplitude may be hardly detected accurately based on sense signals S14 and S15 due to a noise produced in sensor circuit 40. The noise produced in sensor-element-signal amplifiers 143 and 144 largely affects the weak sense signals S14 and S15 supplied to amplifiers 143 and 144, and affects the accuracy of detection of sensor circuit 40 accordingly.

Figure 6:
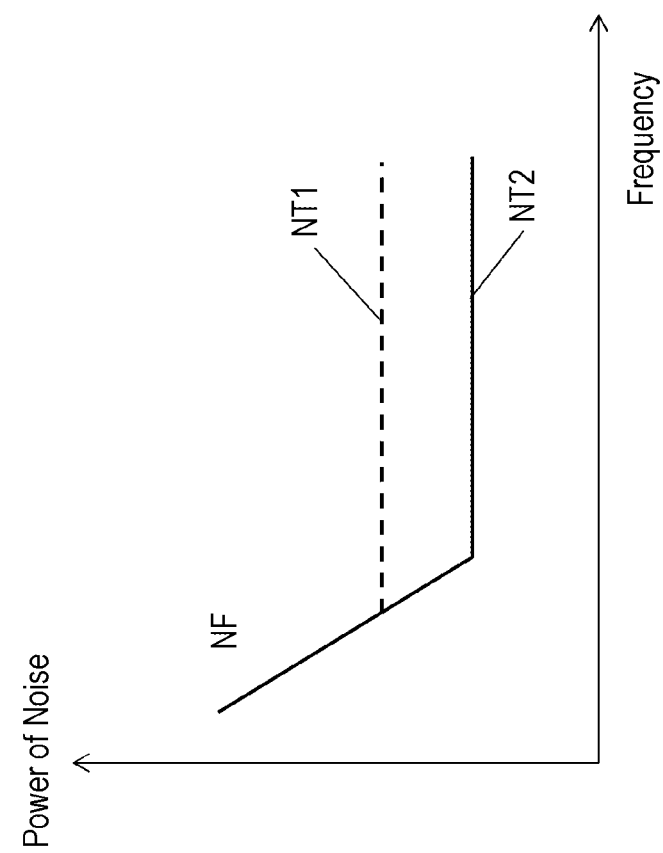
FIG. 6 shows a noise produced in the sensor-element-signal amplifier of the motion sensor in accordance with Embodiment 1.

FIG. 6 shows the noise produced in sensor-element-signal amplifiers 143 and 144. In FIG. 6, the horizontal axis represents frequency expressed in a logarithmic scale, and the vertical axis represents power of the noise expressed in logarithmic scale. When bias-current source 127 supplies a current having amount I1, differential amplifying circuit 124 mainly produces flicker noise NF inversely proportional to the frequency and thermal noise NT1 independent of the frequency. When bias-current source 127 supplies a current having amount I2 larger than amount I1, differential amplifying circuit 124 produces flicker noises NF and thermal noises NT2 independent of the frequency. In both the cases, while the power of flicker noise NF does not change, thermal noise NT2 is smaller than thermal noise NT1. To be more specific, when motion sensor 1001 detects a small motion caused by camera shake, differential amplifying circuit 124 produces smaller noises than when motion sensor 1001 detects a larger motion. Motion sensor 1001 thus can detect the small motion caused by the camera shake accurately. When motion sensor 1001 detects the large motion, differential amplifying circuit 124 produces a large noise; however the large noise does not affect the detection of the large motion. Current amount I1 is small, so that motion sensor 1001 may operate with the small current. As discussed above, motion sensor 1001 changes the current amount supplied from bias-current source 127 in response to the detected motion. Motion sensor 1001 thus provides both of the accurate detection of the small motion at the low-noise mode and detection of the large motion with low power consumption at the normal mode. Thus, bias-current source 127 operates such that the amounts of bias currents I129 and I131 for sensor-element-signal amplifiers 143 and 144 to operate at the low-noise mode are larger than those of bias currents I129 and I131 for sensor-element-signal amplifiers 143 and 144 to operate at the normal mode. The normal mode and the low-noise mode can be switched from the outside of motion sensor 1001.

Controller 50 changes the time constant of anti-oscillation compensating circuit 137 in response to the amount of motion, to determine the time constant to be optimum to the current amount supplied from bias-current source 127, thereby allowing sensor-element-signal amplifiers 143 and 144 to operate stably.

Figure 7:
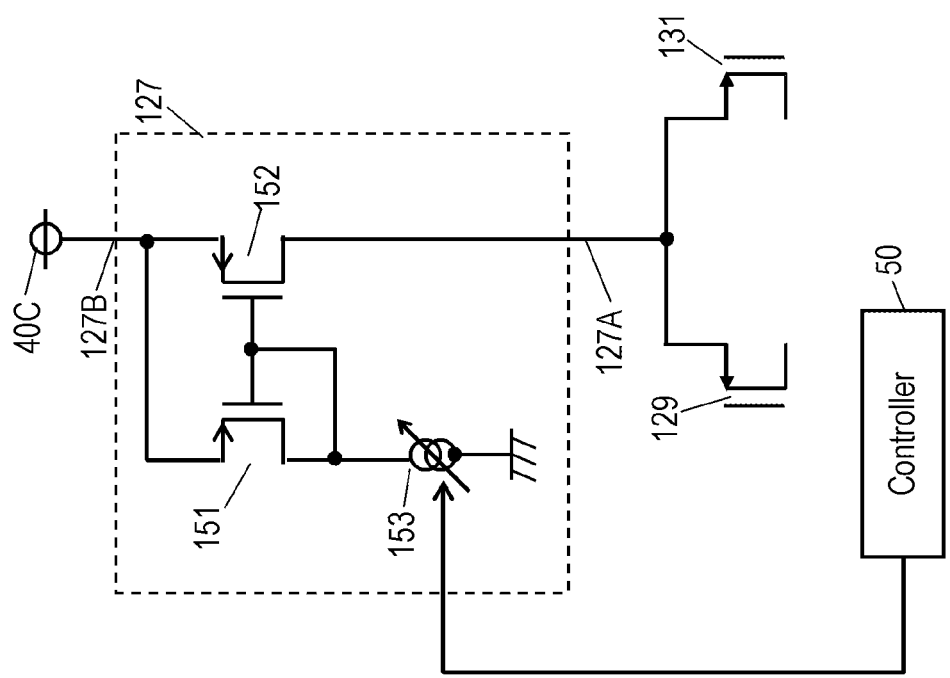
FIG. 7 is a circuit diagram of a bias-current source of the sensor-element-signal amplifier shown in FIG. 5.

FIG. 7 is a circuit diagram of bias-current source 127. Bias-current source 127 includes P-channel FETs 151 and 152 and variable current source 153. The gates of FETs 151 and 152 are connected to the drain of FET 151 while sources of FETs 151 and 152 are connected to power supply 40C, thus forming a current mirror. The drain of FET 151 is connected to variable current source 153. The drain of FET 152 functions as end 127A. Variable current source 153 is controlled by controller 50 to change a current amount. Controller 50 changes the current amount supplied from variable current source 153, thereby changing a current amount flowing out from end 127A.

Figure 8:
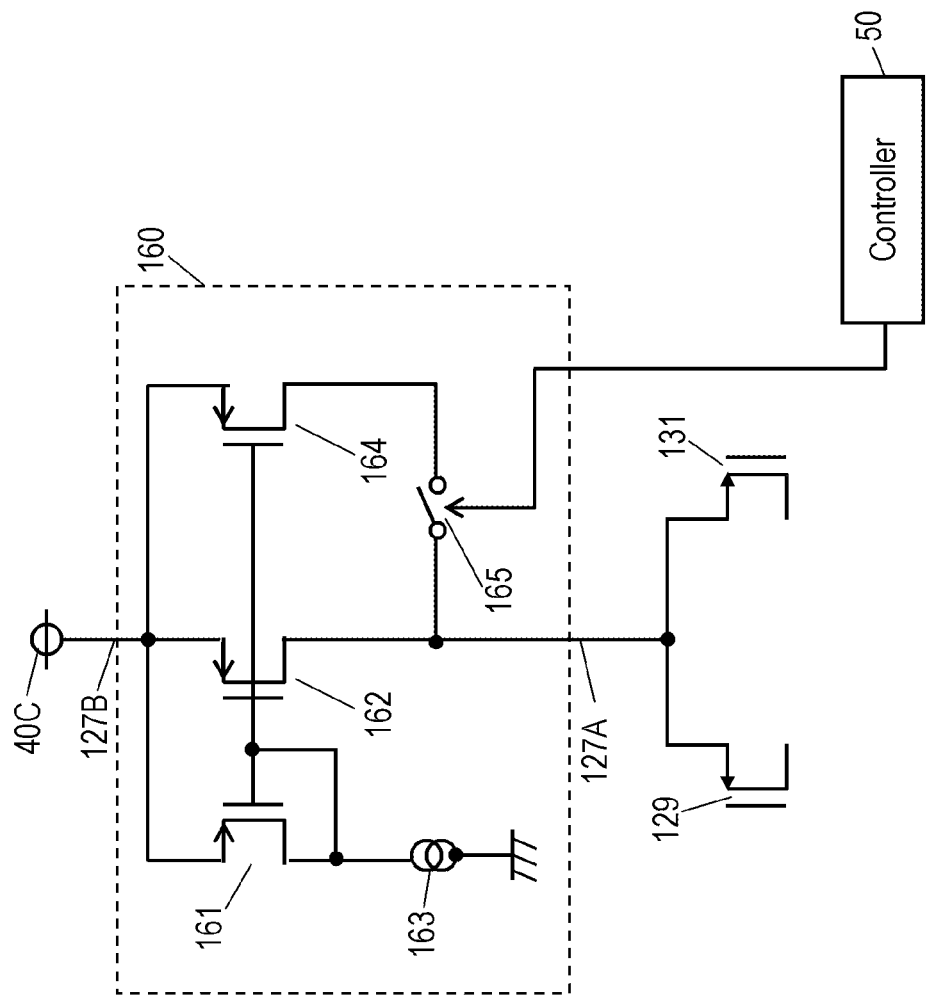
FIG. 8 is a circuit diagram of another bias-current source of the sensor-element-signal amplifier shown in FIG. 5.

FIG. 8 is a circuit diagram of another bias-current source 160. This bias-current source operates as bias-current source 127. Bias-current source 160 includes P-channel FETs 161, 162, and 164, constant current source 163, and switch 165. The gates of FETs 161, 162, and 164 are connected to the drain of FET 161 while the sources of FETs 161, 162, and 164 are connected to power supply 40C, thus forming a current mirror. The drain of FET 161 is connected to constant current source 163. The drain of FET 162 functions as end 127A. Switch 165 is connected between the drain of FET 162 and the drain of FET 164. Controller 50 controls switch 165 to connect and disconnect between the drains of FETs 162 and 164, thereby changing a mirror rate of the current mirror. That is, when controller 50 turns off switch 165 to disconnect the drain of FET 162 from the drain of FET 164, a current having the same amount of the current supplied from constant current source 163 flows from the drain of FET 162. When controller 50 turns on switch 165 to connect the drain of FET 162 to the drain of FET 164, a current having an amount twice the amount of the current supplied from constant current source 163 flows from the drain of FET 162. Controller 50 turns on and off switch 165 to change the current amount flowing out from end 127A of bias-current source 160.

An operation of phase corrector 32 shown in FIG. 1 will be described below. Monitor signal S16 output from monitor unit 16 is input into sensor-element-signal amplifier 22 in which bias-current source 127 of sensor-element-signal amplifiers 143 and 144 of is replaced with a constant current source. Phase corrector 32 shifts a phase of an output of phase shifter 30. When controller 50 changes the amount of the current of bias-current source 127 in response to the amount of the motion, phases of outputs from sensor-element-signal amplifiers 143 and 144 are changed. Controller 50 adjusts the phase to be shifted by phase corrector 32 based on control signal S51 in response to the amount of the motion, namely, in response to the amount of the current supplied from bias-current source 127. Clock generator 31 thus changes the phase of clock signal S31 depending on whether sensor-element-signal amplifiers 143 and 144 operate at the normal mode or at the low-noise mode. The adjustment of the phase of clock signal S31 supplied from clock generator 31 allows synchronous detector 46 to obtain accurately detected signal S46 that contains only the sense component.

Controller 50 changes the amount of the current supplied from bias-current source 127 of each of sensor-element-signal amplifiers 143 and 144 in response to the amount of the motion, and may further change an offset and gain of A/D converter 47. This configuration allows motion sensor 1001 to sense the motion accurately regardless of the amount of the current amount supplied from bias-current source 127.

Controller 50 may change the amount of the current from current source 133 of each of sensor-element-signal amplifiers 143 and 144 in response to the amount of the motion. Amplifying element 134 affects noises produced by sensor-element-signal amplifiers 143 and 144 while amplifying element 134 affects the noises less than amplifying elements 129 to 132. Similarly to of amplifying elements 129 to 132, controller 50 determines the amount of the current of current source 133 to be a predetermined amount at the normal mode, and determines the amount of the current to be an amount of the current larger than the predetermined amount at the low-noise mode. This configuration allows amplifying element 134 to produce a smaller noise and consumes larger power at the low-noise mode than at the normal mode. The sensor thus provides both of an accurate detection of a small amount of the motion and a detection of a large amount of the motion with small current consumption.

Controller 50 may change the value of impedance of I-V converting impedance element 137A of each of sensor-element-signal amplifiers 143 and 144 in response to the amount of the motion. In this case, controller 50 determines the impedance of impedance element 137A to be a predetermined value at the normal mode, and determines the impedance to be a value larger than the predetermined value at the low-noise mode. This configuration causes an S/N ratio of a signal at impedance element 137A to be larger at the low-noise mode than at the normal mode, hence allowing motion sensor 1001 can to a small amount of the motion accurately.

Sensor-element-signal amplifier 22 to which monitor signal S16 is input may be implemented by the same circuit as sensor-element-signal amplifiers 143 and 144 including bias-current source 127 shown in FIG. 5. Controller 50 can change the amount of the current output from bias-current source 127 of each of sensor-element-signal amplifiers 143 and 144, and can further change the amount of the current from bias-current source 127 of sensor-element-signal amplifier 22.

Monitor unit 16 of sensor element 10 shown in FIG. 2 has a smaller area than sensor units 14 and 15, so that capacitor C16 formed by monitor unit 16 has a capacitance smaller than capacitances of capacitors C14 and C15 formed by sensor units 14 and 15. However, the area of the upper electrode or the thickness of the piezoelectric material may be adjusted to allow capacitor C16 to have the same capacitance as capacitors C14 and 15. In this case, controller 50 can change the amount of the current output from bias-current source 127 of sensor-element-signal amplifier 22 similarly to the amount of the current output from bias-current source 127 of sensor-element-signal amplifiers 143 and 144. The change of the amount of the current can eliminate phase corrector 32. That is, in the case that controller 50 changes the current supplied from bias-current source 127 of amplifiers 143 and 144, it is not necessary to adjust the phase of clock signal S31 supplied to synchronous detector 46.

Sensor-element-signal amplifier 243 (244) shown in FIG. 4 includes two differential amplifying circuits 224 and 324 and two amplifying circuits 225 and 325 while sensor-element-signal amplifier 143 (144) shown in FIG. 5 includes single differential amplifying circuit 124 and single amplifying circuit 125. Amplifier 143 (144) thus has a smaller circuit size than amplifier 243 (244), hence allowing motion sensor 1001 to have a small size.

Figure 9:
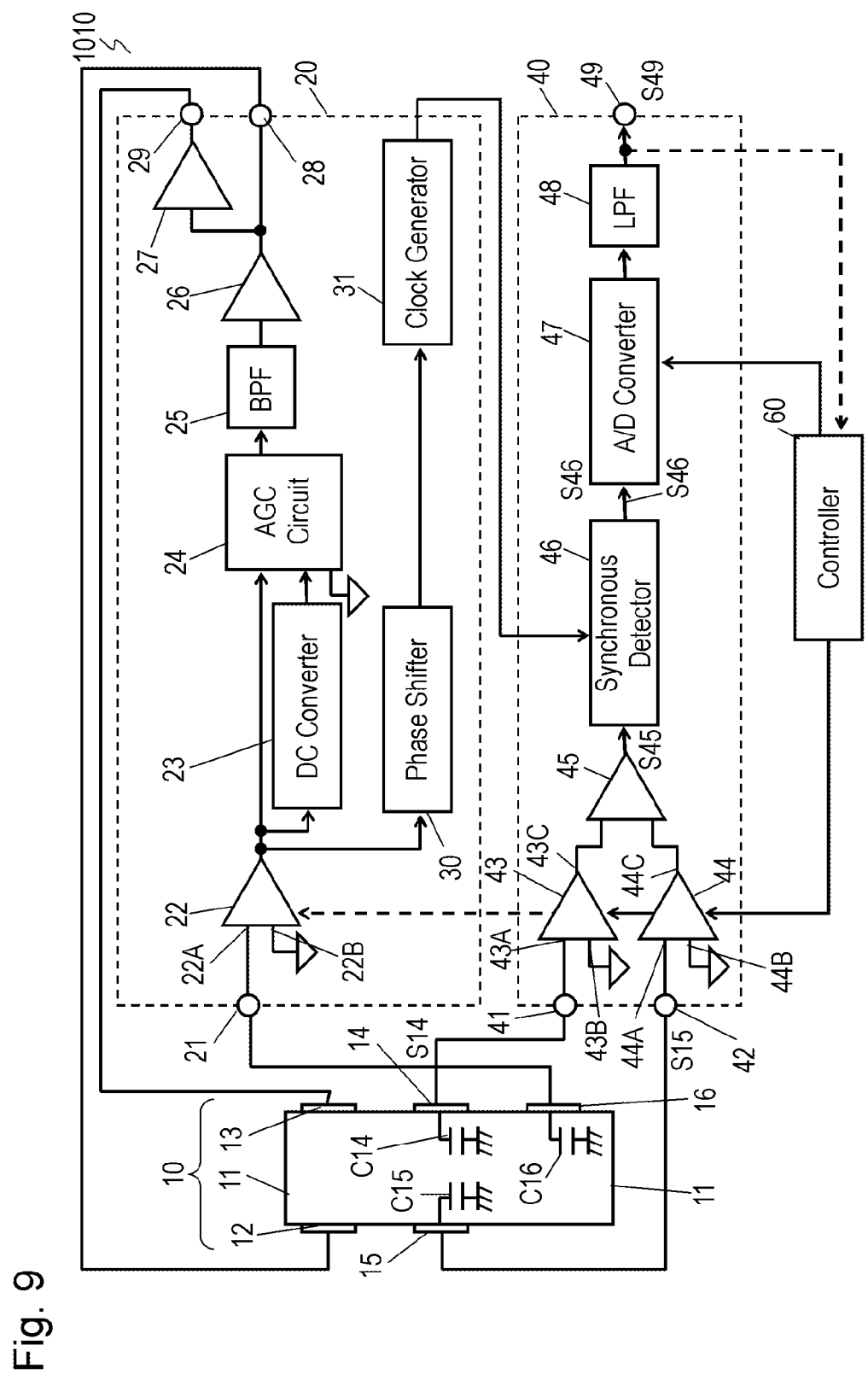
FIG. 9 is a block diagram of another motion sensor in accordance with Embodiment 1.

FIG. 9 is a block diagram of another motion sensor 1010 in accordance with Embodiment 1. In FIG. 9, components identical to those of motion sensor 1001 shown in FIGS. 1 to 8 are denoted by the same reference numerals. Motion sensor 1010 shown in FIG. 9 includes controller 60 instead of controller 50. Controller 60 has no control terminal 51 to which control signal S51 is input.

In the case that sensor-element-signal amplifiers 43 and 44 shown in FIG. 1 function as sensor-element-signal amplifiers 243 and 244 shown in FIG. 4, controller 50 of motion sensor 1001 shown in FIG. 1 activates switches 252 and 253 in response to control signal S51 supplied from control circuit 1003 of electronic apparatus 1002 shown in FIG. 3. Sensor-element-signal amplifier 22 operates similarly to amplifiers 243 and 244, namely, operates switchably between at the normal mode and at the low-noise mode that consumes larger power and produces a smaller noise than the normal mode. Controller 60 of motion sensor 1010 shown in FIG. 9 activates switches 252 and 253 in response to the amount of the detected motion. The structure allows motion sensor 1010 to operate optimally to the amount of the motion without a control signal supplied externally.

In the case that sensor-element-signal amplifiers 43 and 44 shown in FIG. 1 function as sensor-element-signal amplifiers 143 and 144 shown in FIG. 5, controller 50 of motion sensor 1001 shown in FIG. 1 can change the amount of the current output from bias-current source 127 of each of sensor-element-signal amplifiers 143 and 144 in response to control signal S51 supplied from control circuit 1003 of electronic apparatus 1002 shown in FIG. 3. Controller 50 can change the amount of the current output from bias-current source 127 of sensor-element-signal amplifier 22. Sensor-element-signal amplifier 22 operates similarly to sensor-element-signal amplifiers 143 and 144, that is, operates switchably between at the normal mode and at the low-noise mode that consumes larger power and produces a smaller noise than the normal mode. Controller 60 of motion sensor 1010 shown in FIG. 9 changes the amount of the current from bias-current source 127 of sensor-element-signal amplifiers 143 and 144 and also changes the amount of the current from bias-current source 127 of amplifier 22 in response to the amount of the detected motion. This configuration allows motion sensor 1010 to operate optimally to the amount of the motion without the control signal supplied externally.

Controller 50 of motion sensor 1001 shown in FIG. 1 can change the amount of the current supplied from bias-current source 127, similarly to controller 60 shown in FIG. 9, in response to the amount of the detected motion in addition to in response to control signal S51. This configuration allows control circuit 1003 of electronic apparatus 1002 shown in FIG. 3 to allow second functional section 1005 to operate accurately in response to a small amount of the motion.

In Embodiment 1, first functional section 1004 has a predetermined first function, namely, a camera, and each of motion sensors 1001 and 1010 senses a small amount of motion caused by camera shake. First functional section 1004 can have another predetermined first function, such as a game function controlled by a small motion.

Each of motion sensors 1001 and 1010 in accordance with Embodiment 1 includes sensor element 10 for sensing an angular velocity; however, can sense motions, such as acceleration or velocity, other than the angular velocity.

Exemplary Embodiment 2

Figure 10:
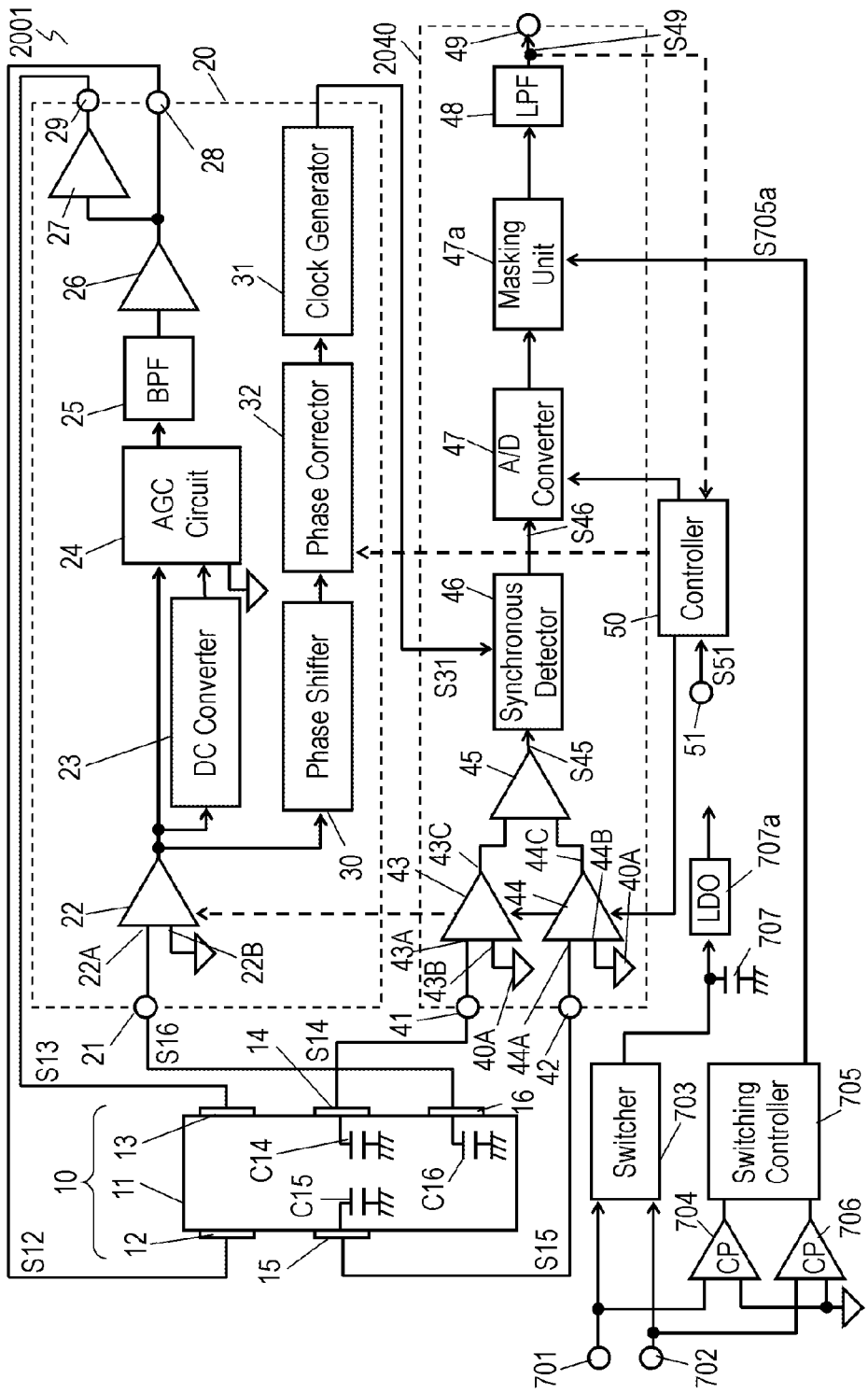
FIG. 10 is a block diagram of a motion sensor in accordance with Exemplary Embodiment 2 of the invention.

FIG. 10 is a block diagram of motion sensor 2001 in accordance with Exemplary Embodiment 2 of the present invention. Motion sensor 2001 is an angular velocity sensor. In FIG. 10, components identical to those of motion sensor 1001 shown in FIG. 1 are denoted by the same reference numerals.

Motion sensor 2001 includes sensor circuit 2040 instead of sensor circuit 40 of motion sensor 1001 in accordance with Embodiment 1. Sensor circuit 2040 processes a signal output from sensor element 10, thereby sensing a motion applied to sensor element 10. Motion sensor 2001 in accordance with Embodiment 2 senses an angular velocity as a motion applied to sensor element 10 similarly to motion sensor 1001 in accordance with Embodiment 1.

Sensor circuit 2040 further masking unit 47*a* connected to A/D converter 47 of sensor circuit 40 shown in FIG. 1. Low pass filter (LPF) 48 is connected to masking unit 47*a*, and is connected to A/D converter 47 via masking unit 47*a*. Masking unit 47*a* receives control signal S705*a* and masks a digital signal of control signal S705*a* in response to control signal S705*a* and outputs the resultant digital signal. LPF 48 outputs motion signal S49 from output terminal 49. Motion signal S49 is obtained by removing an unnecessary signal from the digital signal supplied from masking unit 47*a*.

Figure 11:
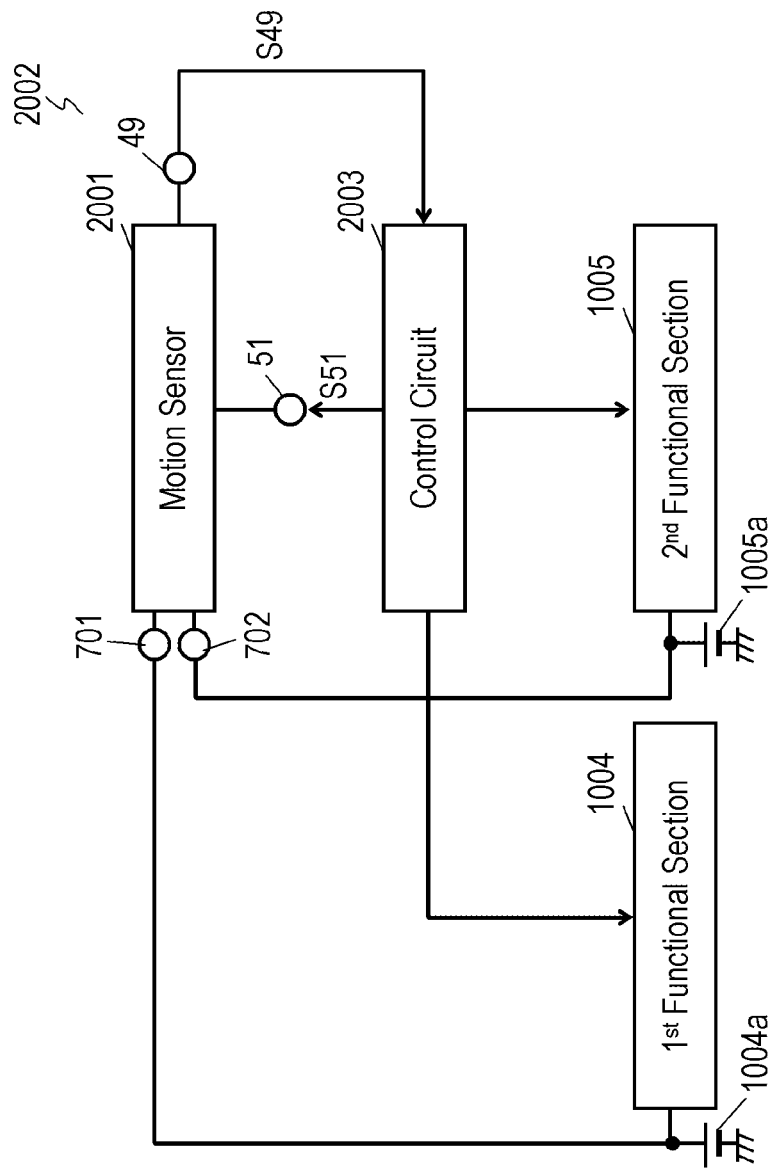
FIG. 11 is a block diagram of an electronic apparatus including the motion sensor in accordance with Embodiment 2.

FIG. 11 is a block diagram of electronic apparatus 2002 employing motion sensor 2001. In FIG. 11, components identical to those of electronic apparatus 1002 shown in FIG. 3 in accordance with Embodiment 1 are denoted by the same reference numerals. Electronic apparatus 2002 in accordance with Embodiment 2 includes control circuit 2003 and motion sensor 2001 shown in FIG. 10, instead of control circuit 1003 of electronic apparatus 1002, and motion sensor 1001 shown in FIG. 3 in accordance with Embodiment 1. Electronic apparatus 2002 further includes first external power supply 1004*a* and second external power supply 1005*a*. First external power supply 1004*a* is disposed to first functional section 1004, and supplies electric power to first functional section 1004 to cause first functional section 1004 to operate. Second external power supply 1005a is disposed to second functional section 1005, and supplies electric power to second functional section 1005 to cause second functional section 1005 to operate. External power supplies 1004a and 1005a supply voltages E4 and E5 to functional sections 1004 and 1005, respectively. When first functional section 1004 operates, control circuit 2003 sets voltage E4 of first external power supply 1004a at voltage V4, and sets a voltage of second external power supply 1005a to 0 (zero). Control circuit 2003 operates, in addition to the operation of control circuit 1003 shown in FIG. 3 in accordance with Embodiment 1, such that control circuit 2003 sets voltage E5 of second external power supply 1005a at voltage V5 and sets a voltage of first external power supply 1004a to 0 (zero) when second functional section 1005 operates. The operation reduces power consumption in total of electronic apparatus 2002. According to Embodiment 2, voltages V4 and V5 are 2.4 (V) and 3.6 (V), respectively.

As shown in FIGS. 10 and 11, motion sensor 2001 in accordance with Embodiment 2 further includes first power supply terminal 701 configured to be connected to first external power supply 1004a, second power supply terminal 702 configured to be connected to second external power supply 1005a, selector 703, first comparator 704, second comparator 706, selector controller 705, low pass filter (LPF) 707, and low drop-out (LDO) regulator 707a. Electronic apparatus 2002 in accordance with Embodiment 2 allows external power supplies 1004a and 1005a which supply electric power to functional sections 1004 and 1005, respectively to supply the electric power to motion sensor 2001. Selector 703 selects one of voltage E4 (V4) supplied from first power supply terminal 701 to first external power supply 1004a and voltage E5 (V5) supplied from second power supply terminal 702 to second external power supply 1005a to obtain voltage E703, and supplies voltage E703 to drive circuit 20 and sensor circuit 2040. First comparator 704 determines voltage E4 of first power supply terminal 701 with a predetermined threshold, and then outputs a signal of high-level and low-level to selector controller 705. In other words, first comparator 704 outputs the signal of high level to selector controller 705 when voltage E4 is equal to or higher than the predetermined threshold, and outputs the signal of low level to selector controller 705 when voltage E4 is lower than the predetermined threshold. Second comparator 706 determines voltage E5 of second power supply terminal 702 with the predetermined threshold, and then outputs a signal of high-level and low-level to selector controller 705. In other words, second comparator 706 outputs the signal of high level to selector controller 705 when voltage E5 is equal to or higher than the predetermined threshold, and outputs the signal of low level to selector controller 705 when voltage E5 is lower than the predetermined threshold. Selector 703 switches between first power supply terminal 701 and second power supply terminal 702 based on the signal supplied from selector controller 705, that is, based on a determination result of first comparator 704 and a determination result of second comparator 706), thereby selecting one of voltage E4 and voltage E5 and outputting the selected voltage to drive circuit 20 and sensor circuit 2040. Masking unit 47a of sensor circuit 2040 masks the signal output from A/D converter 47 for a predetermined time from the time when selector 703 switches between first power supply terminal 701 and second power supply terminal 702, thereby causing the signal supplied to LPF 48 to be constant and not to change. According to Embodiment 2, the predetermined duration is about 1 msec. LPF 707 is connected to an output port of selector 703 for cutting noises.

LPF 707 produces, in response to the switching of selector 703, a transient response of the signal output from A/D converter 47.

Figure 12:
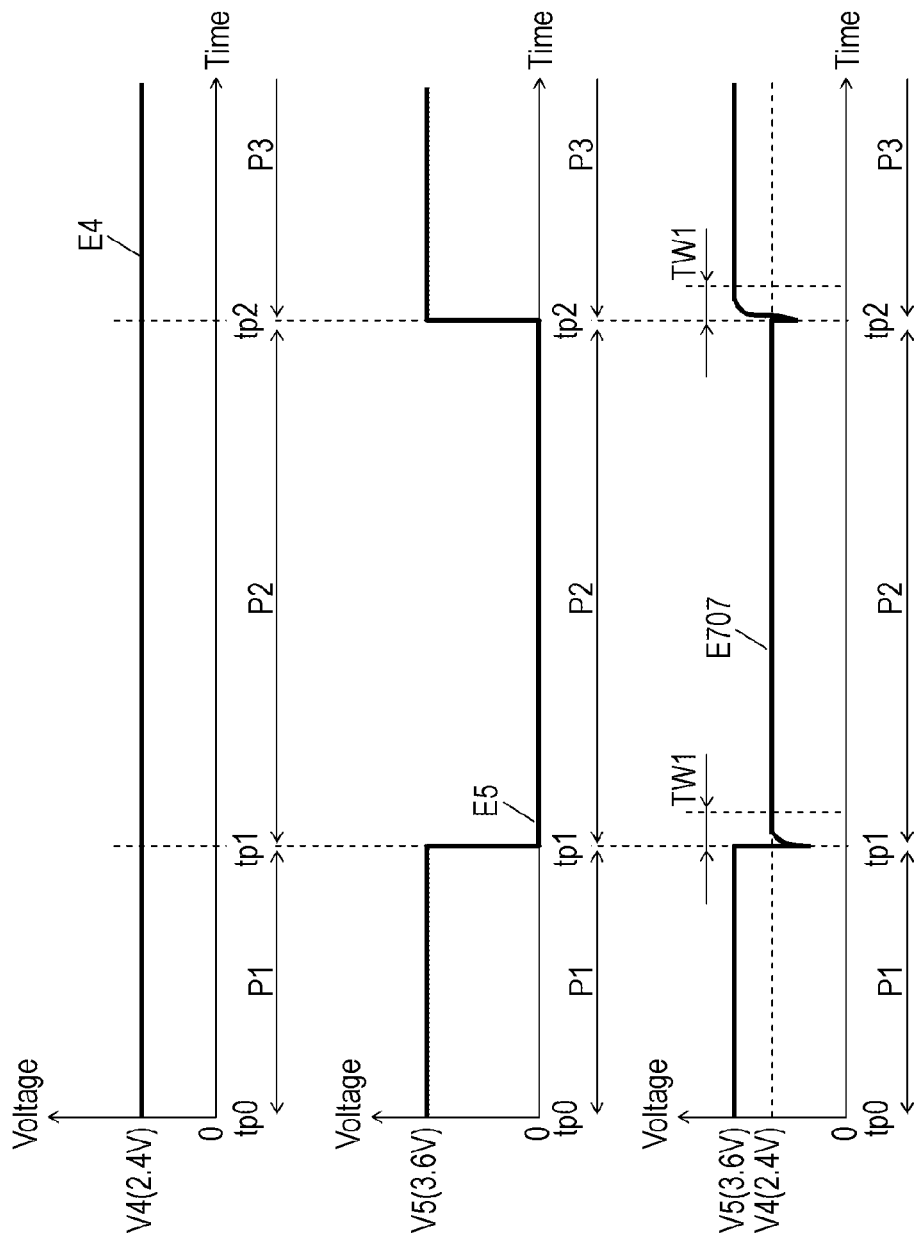
FIG. 12 shows waveforms of the motion sensor in accordance with Embodiment 2 for illustrating an operation of the motion sensor.

Operations of motion sensor 2001 and electronic apparatus 2002 in accordance with Embodiment 2 will be described below. FIG. 12 shows changes of voltage E4 of first external power supply 1004a, voltage E5 of second external power supply 1005a, and voltage E707 output from LPF 707 with respect to time. For duration P1 from time point tp0 to time point tp1, control circuit 2003 selects both of first functional section 1004 and second functional section 1005 to cause functional sections 1004 and 1005 to operate. In the case that both of functional sections 1104 and 1005 operate, voltage E4 of first external power supply 1004a is voltage V4 in order to operate first functional section 1004 while voltage E5 of second external power supply 1005a is voltage V5 in order to operate second functional section 1005. Therefore, comparators 704 and 706 determine voltages E4 and E5, and output signals of high level to selector controller 705.

In electronic apparatus 2002 according to Embodiment 2, when voltages E4 and E5 of external power supplies 1004a and 1005a are voltages V4 and V5, respectively, that is, both are not equal to 0 (zero), selector 703 selects voltage E5 of second external power supply 1005a based on the determination results of comparators 704 and 706 and outputs voltage E5 to LPF 707, not voltage E4 of first external power supply 1004a. Drive circuit 20 uses voltage E5 for driving and vibrating sensor element 10 (V5=3.6V in accordance with Embodiment 2). In sensor circuit 2040, masking unit 47a inputs a signal supplied from A/D converter 47 into LPF 48, and a signal in response to the motion is output from output terminal 49.

After that, as shown in FIG. 12, control circuit 2003 stops the operation of second functional section 1005 at time point tp1, and causes only first functional section 1004 to operate for duration P2 from time point tp1 to tome point tp2. In duration P2, second functional section 1005 does not operate. When second functional section 1005 stops its operation, voltage E5 of second external power supply 1005a supplied to second power supply terminal 702 becomes 0 (zero). This operation allows first comparator 704 to continue outputting the signal of high level to selector controller 705m and allows second comparator 706 to output a signal of low level to selector controller 705. Based on the determination results of comparators 704 and 705 in voltages E4 and E5, selector controller 705 selects voltage E4 (V4=2.4V in accordance with Embodiment 2) supplied to first power supply terminal 701 and outputs voltage E4 to selector 703. At time point tp1 when selector 703 switches between voltages E4 and E5, voltage E707 output from LPF 707 falls to a low voltage of 1.717V lower than voltage V4 due to the transient response, and then, reaches voltage V4. In motion sensor 2001 in accordance with Embodiment 2, second comparator 706 supplies the signal of low level to masking unit 47a of sensor circuit 2040 via selector controller 705. Masking unit 47a masks the signal output from A/D converter 47 for predetermined duration TW1 starting from time point tp1, and outputs a signal of constant value to LPF 48 regardless of a change of voltage E707. When predetermined duration TW1 elapses from time point tp1, voltage E707 stays at voltage E4 supplied to first power supply terminal 701. In accordance with Embodiment 2, predetermined duration TW1 is about 1 msec. After predetermined duration TW1 elapses from time point tp1, masking unit 47a supplies, to LPF 48, the signal output from A/D converter 47 without masking. This operation allows sensor circuit 2040 to output signals from output terminal 49 in response to the motion without being affected by the change of voltage E707.

In other words, in motion sensor 2001 in accordance with Embodiment 2, masking unit 47a of sensor circuit 2040 allows an output signal from sensor circuit 2040 not to change for the predetermined duration (about 1 msec in accordance with Embodiment 2) when selector 703 switches. As a result, when the output signal tends to change due to the transient response at the switching of selector 703, masking unit 47a causes the output signal to unchanged for the predetermined duration, thereby stabilizing the output signal.

When control circuit 2003 restarts the operation of second functional section 1005 at time point tp2, voltage E5 supplied to second power supply terminal 702 changes from 0 (zero) to voltage V5 (=3.6V in accordance with Embodiment 2). To be more specific, first comparator 704 continues supplying the signal of high level to selector controller 705, and second comparator 706 outputs the signal of high level to selector controller 705. This operation allows selector 703 to output voltage E5 (V5) to be supplied to second power supply terminal 702 for duration P3 after time point tp2. At time point tp2, voltage E707 output from LPF 707 temporarily falls to 2.29V and tends to change due to the transient response. In motion sensor 2001 in accordance with Embodiment 2, second comparator 706 supplies the signal of high level to masking unit 47a of sensor circuit 2040 via selector controller 705. Masking unit 47a masks the signal output from A/D converter 47 for predetermined duration TW1 starting from time point tp2, and outputs a signal of constant value to LPF 48 regardless of a change in voltage E707. When predetermined duration TW1 starts from time point tp2, voltage E707 is maintained at voltage E5 supplied to second power supply terminal 702. When predetermined duration TW1 elapses from time point tp2, masking unit 47a supplies, to LPF 48, the signal output from A/D converter 47 with no masking. This operation allows sensor circuit 2040 to output signals from output terminal 49 in response to the motion without being affected by the change of voltage E707.

Components, such as masking unit 47a and power supply terminal 701 and 702, of motion sensor 2001 shown in FIG. 10 in accordance with Embodiment 2 are included in motion sensor 1001 shown in FIG. 1 in accordance with Embodiment 1. Those components can be included in motion sensor 1010 shown in FIG. 9 in accordance with Embodiment 1, providing the same effects.

Exemplary Embodiment 3

Figure 13:
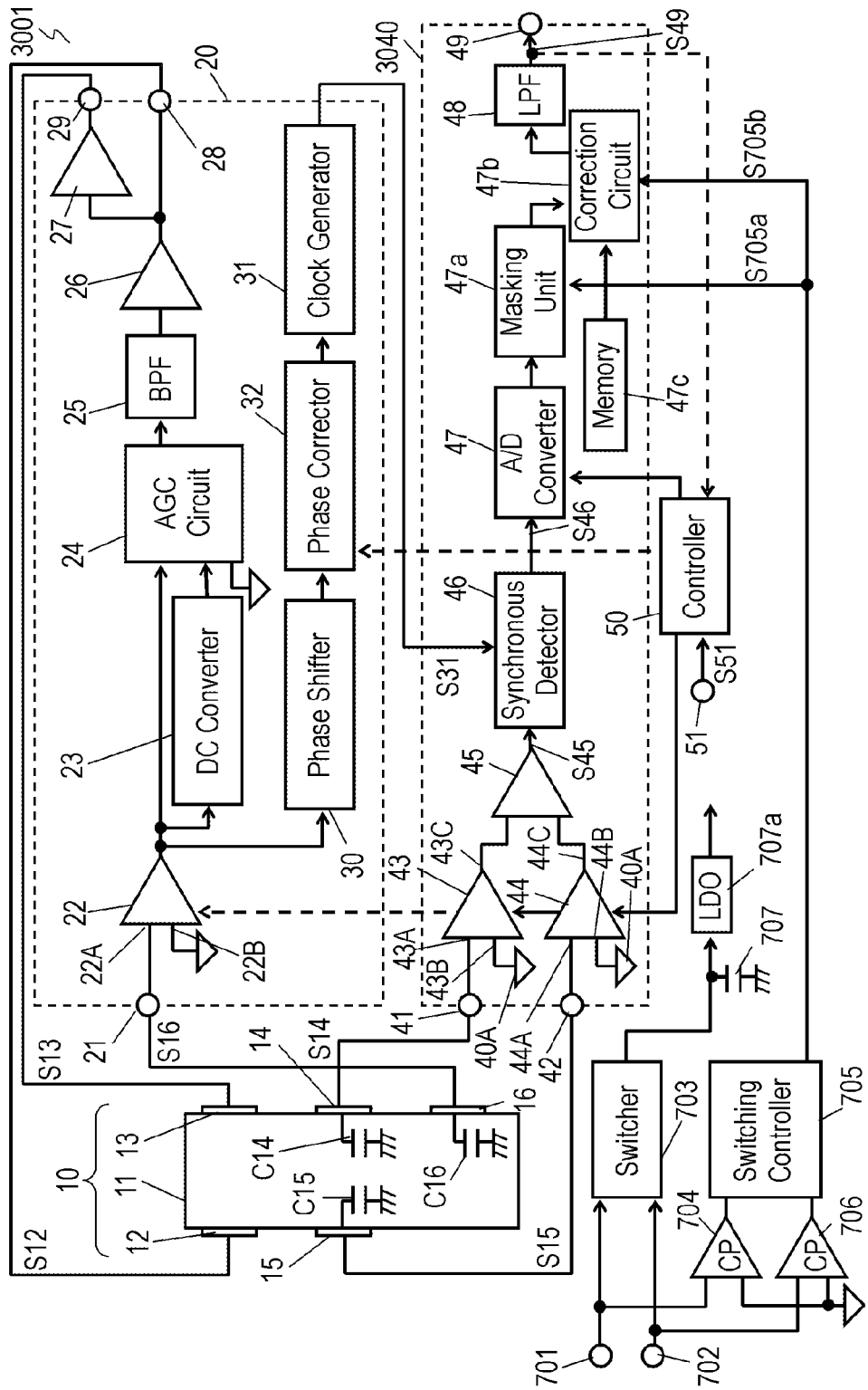
FIG. 13 is a block diagram of a motion sensor in accordance with Exemplary Embodiment 3 of the invention.

FIG. 13 is a block diagram of motion sensor 3001 in accordance with Exemplary Embodiment 3 of the present invention. Motion sensor 3001 is an angular velocity sensor. In FIG. 13, components identical to those of motion sensor 2001 shown in FIG. 10 in accordance with Embodiment 2 are denoted by the same reference numerals.

Motion sensor 3001 includes sensor circuit 3040 instead of sensor circuit 2040 of motion sensor 2001. Sensor circuit 3040 senses a motion applied to sensor element 10 by processing a signal output from sensor element 10. Motion sensor 3001 is an angular velocity sensor for sensing an angular velocity as a motion, applied to sensor element 10) similarly to motion sensor 2001.

Sensor circuit 3040 further includes correction circuit 47b connected to masking unit 47a of sensor circuit 2040 shown in FIG. 10 in accordance with Embodiment 2. Masking unit 47a in accordance with Embodiment 3 receives control signal S705a, and masks a digital signal in response to control signal S705a and outputs the masked digital signal. Correction circuit 47b corrects the digital signal output from masking unit 47a with a correction value previously stored in memory 47c. Memory 47c is implemented by a ROM in accordance with Embodiment 3. LPF 48 is connected to A/D converter 47 via correction circuit 47b and masking unit 47a. LPF 48 outputs, from output terminal 49, motion signal S49, obtained by removing unnecessary signals from the digital signal corrected by correction circuit 47b.

Figure 14:
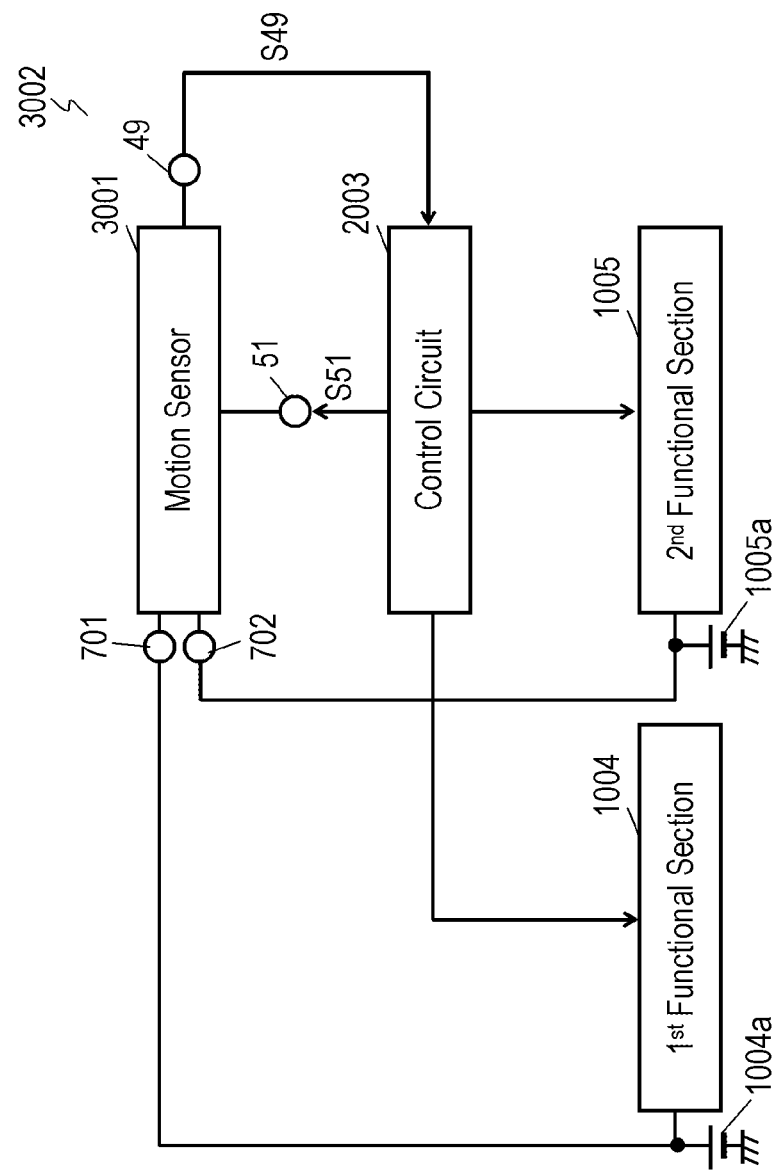
FIG. 14 is a block diagram of an electronic apparatus including the motion sensor in accordance with Embodiment 3.

FIG. 14 is a block diagram of electronic apparatus 3002 including motion sensor 3001. In FIG. 14, components identical to those of motion sensor 2002 shown in FIG. 11 in accordance with Embodiment 2 are denoted by the same reference numerals. Electronic apparatus 3002 includes motion sensor 3001 shown in FIG. 13 instead of motion sensor 2001 of electronic apparatus 2002 shown in FIG. 11 in accordance with Embodiment 2.

In motion sensor 3001 in accordance with Embodiment 3, selector controller 705 outputs control signal S705b to correction circuit 47b for activating correction circuit 47b at the switching between power terminals 701 and 702. LPF 48 connected to a rear stage of correction circuit 47b produces a transient response of a signal output from A/D converter 47 with respect to the switching of selector 703.

Figure 15:
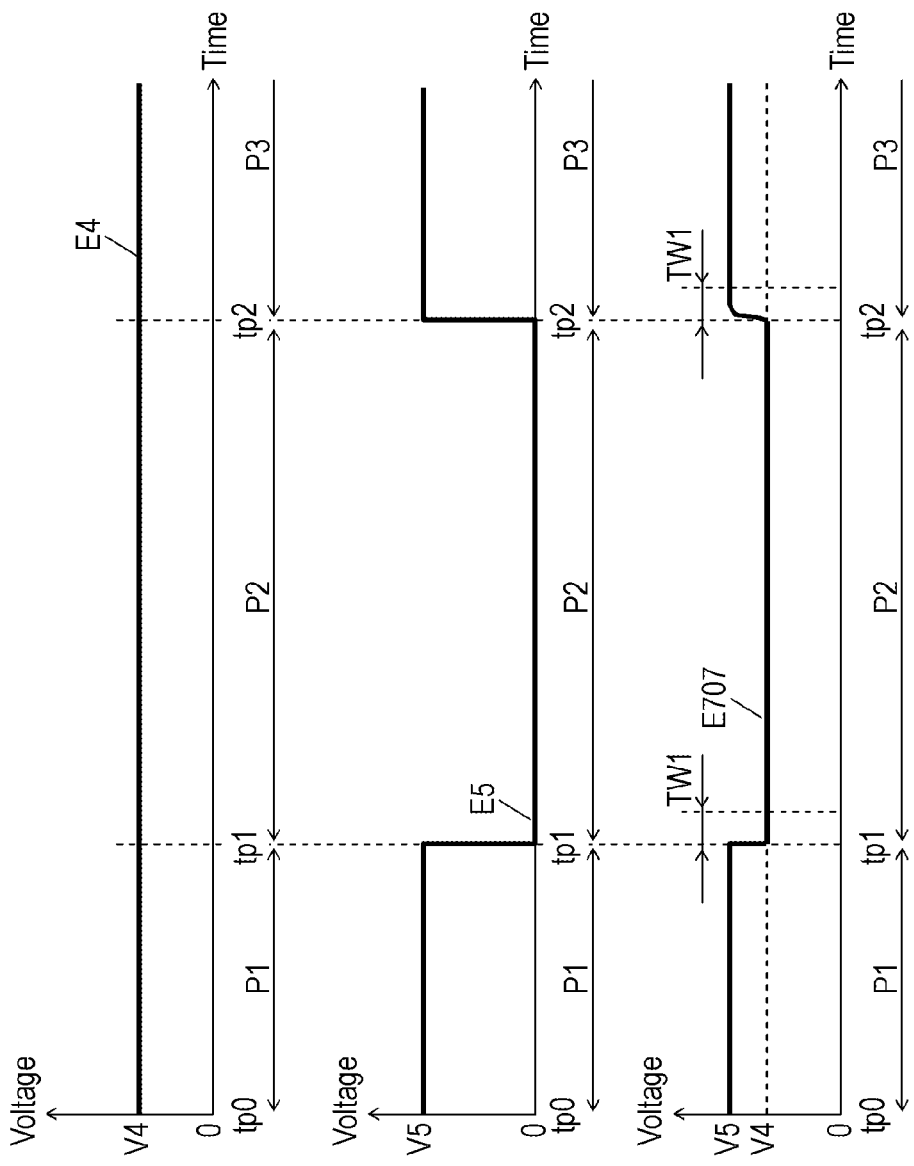
FIG. 15 shows waveforms of the motion sensor in accordance with Embodiment 3 for illustrating an operation of the motion sensor.

Operations of motion sensor 3001 and electronic apparatus 3002 in accordance with Embodiment 3 will be described below. FIG. 15 shows changes of voltage E4 of first external power supply 1004a, voltage E5 of second external power supply 1005a, and voltage E707 output from LPF 707 with respect to time. In FIG. 15, items identical to those of motion sensor 2001 shown in FIG. 12 in accordance with Embodiment 2 are denoted by the same reference numerals. For duration P1 from time point tp0 to time point tp1, control circuit 2003 selects both of first functional sections 1004 and second functional section 1005 to cause functional sections 1004 and 1005 to operate. When both of functional sections 1004 and 1005 operate, second external power supply 1005a of second functional section 1005 over first external power supply 1004a to drive and causes sensor element 10 to vibrate, similarly to motion sensor 2001 in accordance with Embodiment 2. Sensor-element-signal amplifiers 243 and 244 shown in FIG. 4 in accordance with Embodiment 1 used as sensor-element-signal amplifiers 43 and 44 change gains of amplifiers 43 and 44, i.e., conversion rates at which currents are converted to voltages in amplifiers 43 and 44. Selector 703 selects and outputs voltage E5 (V5) supplied to second power supply terminal 702 over voltage E4. Voltage E5 output from selector 703 causes switch 251 to connect input terminals 43A and 44A to branch end 251C, and also causes switch 252 to connect branch end 252C to output ports 43C and 44C. Then, sensor-element-signal amplifying circuit 353 is selected out of sensor-element-signal amplifying circuits 253 and 353, thereby obtaining a large gain.

After that, as shown in FIG. 15, control circuit 2003 stops the operation of second functional section 1005 at time point tp1. For duration P2 from time point tp1 to time point tp2, control circuit 2003 activates only first functional section 1004 and continues deactivating second functional section 1005. When the operation of second functional section 1005 stops, selector 703 outputs voltage E4 (V4) of first external power supply 1004a supplied to first power supply terminal 701, similarly to motion sensor 2001 in accordance with Embodiment 2. A signal of low level is supplied from second comparator 706 to masking unit 47a of sensor circuit 3040 via selector controller 705. Similarly to motion sensor 2001 in accordance with Embodiment 2, masking unit 47a masks the signal output from A/D converter 47 for predetermined duration TW1, and continues outputting signals of constant value regardless of a change of voltage E707. In motion sensor 3001 in accordance with Embodiment 3, switch 251 connects input ports 43A and 44A to branch end 251B, and switch 352 connects branch end 252B to output ports 43C and 44C. Then, sensor-element-signal amplifying circuit 253 is selected out of sensor-element-signal amplifying circuits 253 and 353, thereby obtaining a smaller gain.

The change of the gains of sensor signal amplifiers 43 and 44 shifts phases of signals output from not only differential amplifier 45, synchronous detector 46, but also from A/D converter 47. In motion sensor 3001 in accordance with Embodiment 3, memory 47c previously stores an amount of change of the phases of the signals as correction values. This change is produced when selector 703 switches between external power supplies 1004a and 1005a. Based on the correction values stored in memory 47c, correction circuit 47b corrects a signal output from masking unit 47a, i.e., a signal output from A/D converter 47). In other words, in motion sensor 3001 in accordance with Embodiment 3, the change in output signals produced at the switching of the gains of sensor-element-signal amplifiers 43 and 44 and at the switching of external power supplies 1004a and 1005a can be corrected, thereby allowing sensor element 10 to accurately sense the motion applied thereto.

When control circuit 2003 restarts the operation of second functional section 1005 at time point tp2, voltage E5 supplied to second power terminal 702 from second external power supply 1005a changes from 0 (zero) to voltage V5 (=3.6 V in accordance with Embodiment 3, similarly to motion sensor 2001 in accordance with Embodiment 2. For duration P3 starting from time point tp2, similarly to motion sensor 2001 I accordance with Embodiment 2, selector controller 705 controls selector 703 to output voltage E5 supplied to second power supply terminal 702. At this moment, controller 50 changes the gains of sensor-element-signal amplifiers 43 and 44 having input ports 43A and 44A into values larger than that for duration P2, and returns the gains to that for duration P1. Motion sensor 3001 in accordance with Embodiment 3 corrects an output signal from A/D converter 47 changed due to a change of the gains at time point tp2, thereby allowing sensor element 10 to accurately sense the motion applied thereto.

As discussed above, the processed sense-signal changes when selector 703 switches between first power supply terminal 701 and second power supply terminal 702. Correction circuit 47b corrects the change of the sense-signal at the switching between power supply terminals 701 and 702.

In motion sensor 3001 shown in FIG. 13 in accordance with Embodiment 3, sensor circuit 3040 may not necessarily include masking unit 47a. In this case, correction circuit 47b is directly connected to A/D converter 47, and corrects the output signal from A/D converter 47 based on the correction values stored in memory 47c, providing similar effects.

In motion sensor 3001 shown in FIG. 13 in accordance with Embodiment 3, components, such as masking unit 47a, correction circuit 47b, and memory 47c, are combined with motion sensor 1001 shown in FIG. 1 in accordance with Embodiment 1. These components may be combined with motion sensor 1010 shown in FIG. 9 in accordance with Embodiment 1, providing the same effects.

INDUSTRIAL APPLICABILITY

A motion sensor according to the present invention can sense a motion of a large amount and a motion of a small amount, and can be widely used as sensors to be mounted to multi-functional and compact electronic apparatuses, such as digital camera, portable game machine, and PDA.

REFERENCE MARK

10 Sensor Element
11 Vibrator
14 Sensor Unit
15 Sensor Unit
16 Monitor Unit
20 Drive Circuit
22 Sensor-Element-Signal Amplifier (Second Sensor-Element-Signal Amplifier)
26 Output Amplifier
31 Clock Generator
40 Sensor Circuit
43 Sensor-Element-Signal Amplifier (First Sensor-Element-Signal Amplifier)
45 Differential Amplifier
46 Synchronous Detector
47a Masking Unit
47b Correction Circuit
50 Controller
124 Differential Amplifying Circuit
125 Amplifying Circuit
127 Bias-Current Source (First Bias-Current Source, Second Bias-Current Source)
129 Amplifying Element (First Amplifying Element, Second Amplifying Element)
137 Anti-oscillation Compensating Circuit
143 Sensor-Element-Signal Amplifier (First Sensor-Element-Signal Amplifier)
229 Amplifying Element (First Amplifying Element)
251 Switch
251A Common End
251B Branch End (First Branch End)
251C Branch End (Second Branch End)
329 Amplifying Element (Second Amplifying Element)
701 First Power Supply Terminal
702 Second Power Supply Terminal
703 Selector
704 First Comparator
705 Selector Controller
706 Second Comparator
1001 Motion Sensor
1002 Electronic Apparatus
1003 Control Circuit
1004 First Functional Section
1004a First External Power Supply
1005 Second Functional Section
1005a Second External Power Supply
2040 Sensor Circuit
3040 Sensor Circuit

The invention claimed is:
1. An angular velocity sensor comprising:
a sensor element that outputs a sense signal in response to an angular velocity applied thereto; and
a sensor circuit including at least one of a first amplifier, an A/D converter and a low pass filter, the sensor circuit configured to receive the sense signal,
wherein the sensor circuit is able to operate switchably between at a normal mode and at a low-noise mode that consumes larger electric power and produces a lower noise than the normal mode.

2. The angular velocity sensor according to claim 1,
wherein the first amplifier includes:
  a switch having a common end that receives the sense signal, a first branch end, and a second branch end, the switch connecting the common end selectively to the first branch end and the second branch end;
  a first amplifying element connected to the first branch end of the switch; and
  a second amplifying element connected to the second branch end of the switch,
wherein the first amplifying element consumes larger electric power and produces a lower noise than the second amplifying element, and
wherein the switch is switched to allow the first amplifier to operate selectively at the normal mode and at the low-noise mode.

3. The angular velocity sensor according to claim 1,
wherein the first amplifier includes:
  an amplifying element; and
  a bias-current source that supplies a bias current to the amplifying element, and
wherein an amount of the bias current is switchable.

4. The angular velocity sensor according to claim 3, wherein the bias-current source supplies a larger amount of the bias current when the first amplifier operates at the low-noise mode than when the first amplifier operates at the normal mode.

5. The angular velocity sensor according to claim 1, wherein the normal mode and the low-noise mode are switchable from outside of the angular velocity sensor.

6. The angular velocity sensor according to claim 1, further comprising a controller that switches between the normal mode and the low-noise mode in response to an amount of the angular velocity.

7. The angular velocity sensor according to claim 1,
wherein the sensor element includes:
  a vibrator;
  a monitor unit that outputs a monitor signal in response to a vibration of the vibrator; and
  a sensor unit that outputs the sense signal while the vibrator vibrates,
wherein the angular velocity sensor further comprising a drive circuit including a clock generator that generates a clock signal based on the monitor signal;
wherein the sensor circuit includes
  a synchronous detector that synchronously detects the sense signal by using the clock signal, and
wherein the clock generator changes a phase of the clock signal depending on whether the first amplifier operates at the normal mode or at the low-noise mode.

8. The angular velocity sensor according to claim 1,
wherein the sensor element includes:
  a vibrator;
  a monitor unit that outputs a monitor signal in response to a vibration of the vibrator; and
  a sensor unit that outputs the sense signal while the vibrator vibrates,
the angular velocity sensor further comprising a drive circuit including:
  a second amplifier that receives the monitor signal; and
  a clock generator that generates a clock signal based on an output from the second amplifier,
wherein the sensor circuit includes:
  a synchronous detector that synchronously detects the sense signal by using the clock signal,
wherein the second amplifier includes:
  a second bias-current source that outputs a current and changes an amount of the current output from the second bias-current source; and
  a second amplifying element that receives the monitor signal and receives the current output from the second bias-current source, and
wherein the second amplifier operates switchably between at the normal mode and at the low-noise mode.

9. The angular velocity sensor according to claim 1,
wherein the first amplifier further includes:
  a differential amplifying circuit;
  an amplifying circuit that amplifies an output from the differential amplifying circuit, and feeds back the output to the differential amplifying circuit to constitute a feedback loop; and
  an anti-oscillation compensating circuit connected to the amplifying circuit and having a time constant, the anti-oscillation compensating circuit preventing an oscillation of the feedback loop,
wherein the anti-oscillation compensating circuit changes the time constant depending on whether the first amplifier operates at the normal mode or at the low-noise mode.

10. The angular velocity sensor according to claim 1, further comprising:
  a first power supply terminal that receives a voltage from a first external power supply;
  a second power supply terminal that receives a voltage from a second external power supply; and
  a selector that selects a voltage out of the voltage received at the first power supply terminal and the voltage received at the second power supply terminal by switching between the first power supply terminal and the second power supply terminal, and supplies the selected voltage to the sensor circuit,
wherein the sensor circuit outputs a signal corresponding to the sensed angular velocity, and
wherein the sensor circuit includes a masking unit operable to cause the signal output from the sensor circuit to be constant for a predetermined duration from a time when the selector switches between the first power supply terminal and the second power supply terminal.

11. The angular velocity sensor according to claim 10, further comprising:
  a first comparator that determines the voltage received at the first power supply terminal;
  a second comparator that determines the voltage received at the second power supply terminal; and
  a selector controller for controlling the selector based on a determination result of the first comparator and a determination result of the second comparator.

12. The angular velocity sensor according to claim 11, wherein the selector controller controls the masking unit based on the determination result of the first comparator and the determination result of the second comparator.

13. The angular velocity sensor according to claim 1, further comprising:
  a first power supply terminal that receives a voltage from a first external power supply;
  a second power supply terminal that receives a voltage from a second external power supply; and
  a selector that selects a voltage out of the voltage received at the first power supply terminal and the voltage received at the second power supply terminal by switching between the first power supply terminal and the second power supply terminal, and supplies the selected voltage to the sensor circuit, wherein the sense signal changes when the selector switches between the first power supply terminal and the second power supply terminal, and wherein the sensor circuit includes a correction circuit that corrects the change of the sense signal when the selector switches between the first power supply terminal and the second power supply terminal.

14. An electronic apparatus comprising:
the angular velocity sensor according to claim 1;
a first functional section that executes a first predetermined function;
a second functional section that executes a second predetermined function; and
a control circuit operable to
control the first functional section and the second functional section,
cause the sensor circuit to operate at the normal mode while the second functional section operates, and
cause the sensor circuit to operate at the low-noise mode while the first functional section operates.

15. The electronic apparatus according to claim 14, further comprising:
a first power supply terminal that receives a voltage from a first external power supply;
a second power supply terminal that receives a voltage from a second external power supply; and
a selector that selects a voltage out of the voltage received at the first power supply terminal and the voltage received at the second power supply terminal by switching between the first power supply terminal and the second power supply terminal, and supplies the selected voltage to the sensor circuit,
wherein the sensor circuit outputs a signal corresponding to the sensed angular velocity, and
wherein the sensor circuit includes a masking unit that causes that signal output from the sensor circuit to be constant for a predetermined duration from a time when the selector switches between the first power supply terminal and the second power supply terminal.

16. The electronic apparatus according to claim 15, further comprising:
a first comparator that determines the voltage received at the first power supply terminal;
a second comparator that determines the voltage received at the second power supply terminal; and
a selector controller that controls the selector based on a determination result of the first comparator and a determination result of the second comparator.

17. The electronic apparatus according to claim 16, wherein the selector controller controls the masking unit based on the determination result of the first comparator and the determination result of the second comparator.

18. The electronic apparatus according to claim 14, further comprising:
a first power supply terminal that receives a voltage from a first external power supply;
a second power supply terminal that receives a voltage from a second external power supply; and
a selector that selects a voltage out of the voltage received at the first power supply terminal and the voltage received at the second power supply terminal by switching between the first power supply terminal and the second power supply terminal, and supplies the selected voltage to the sensor circuit,
wherein the sense signal changes when the selector switches between the first power supply terminal and the second power supply terminal, and
wherein the sensor circuit includes a correction circuit that corrects the change of the sense signal when the selector switches between the first power supply terminal and the second power supply terminal.

19. The angular velocity sensor according to claim 1, further comprising:
a controller that switches between the normal mode and the low-noise mode,
wherein the controller is connected to at least one of the first amplifier and the A/D converter.

20. The angular velocity sensor according to claim 1, further comprising:
a controller that switches between the normal mode and the low-noise mode,
wherein the controller is connected to at least one of the first amplifier and the A/D converter and has a control terminal that receives a control signal.

21. The angular velocity sensor according to claim 20, wherein
the control terminal receives the control signal from outside of the angular velocity sensor.

22. The angular velocity sensor according to claim 1, wherein
the normal mode is a mode to detect a motion intentionally applied by an user, and
the low-noise mode is a mode to detect a vibration due to camera shaking.

* * * * *